(12) United States Patent
Hayakawa et al.

(10) Patent No.: US 6,867,457 B2
(45) Date of Patent: Mar. 15, 2005

(54) SEMICONDUCTOR DEVICE AND LIQUID JETTING DEVICE USING THE SAME

(75) Inventors: Yukihiro Hayakawa, Kanagawa (JP); Kei Fujita, Kanagawa (JP); Mineo Shimotsusa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/615,288

(22) Filed: Jul. 9, 2003

(65) Prior Publication Data

US 2004/0007767 A1 Jan. 15, 2004

(30) Foreign Application Priority Data

Jul. 10, 2002 (JP) ........................................ 2002-201687

(51) Int. Cl.[7] .......................... H01L 29/76; H01L 29/94; H01L 31/062; H01L 31/113; H01L 31/119
(52) U.S. Cl. ...................................... 257/335; 257/133
(58) Field of Search ............................... 257/133, 130, 257/156, 262, 270, 335, 328

(56) References Cited

U.S. PATENT DOCUMENTS

| | | | |
|---|---|---|---|
| 4,819,044 A | 4/1989 | Murakami | 357/23.4 |
| 5,119,159 A * | 6/1992 | Hoshi | 257/328 |
| 5,221,850 A | 6/1993 | Sakurai | 257/173 |
| 5,517,224 A | 5/1996 | Kaizu et al. | 347/59 |
| 5,567,630 A | 10/1996 | Matsumoto et al. | 437/31 |
| 5,585,650 A * | 12/1996 | Kumagai | 257/124 |
| 5,801,431 A | 9/1998 | Ranjan | 257/659 |
| 6,290,334 B1 | 9/2001 | Ishinaga et al. | 347/59 |
| 6,302,504 B1 | 10/2001 | Imanaka et al. | 347/9 |
| 6,373,110 B2 * | 4/2002 | Itoh et al. | 257/401 |

FOREIGN PATENT DOCUMENTS

| | | |
|---|---|---|
| EP | 0574911 A2 | 12/1993 |
| EP | 08-097410 | 4/1996 |
| EP | 1221720 A2 | 7/2002 |
| GB | 2309589 A | 7/1997 |
| JP | 62-98764 | 5/1987 |
| JP | 5-129597 | 5/1993 |
| JP | 5-185594 | 7/1993 |
| JP | 6-69497 | 3/1994 |
| JP | 8-97410 | 4/1996 |
| JP | 9-307110 | 11/1997 |
| JP | 10-34898 | 2/1998 |

* cited by examiner

Primary Examiner—Phat X. Cao
(74) Attorney, Agent, or Firm—Fitzpatrick, Cella, Harper & Scinto

(57) ABSTRACT

A semiconductor device having a plurality of electrothermal conversion elements and a plurality of switching elements for flowing current through the electrothermal conversion elements, respectively formed on a semiconductor substrate of a first conductivity type, wherein each of the switching elements is an insulated gate field effect transistor including: a first semiconductor region of a second conductivity type opposite to the first conductivity type, the first semiconductor region being formed on a principal surface of the semiconductor substrate, a second semiconductor region of the first conductivity type for providing a channel region, the second semiconductor region being formed adjacent to the first semiconductor region, a source region of the second conductivity type formed in a surface layer of the second semiconductor region, a drain region of the second conductivity type formed in a surface layer of the first semiconductor region, and a gate electrode formed on a gate insulating film on the channel region, and a resistivity of the semiconductor substrate is 5 to 18 Ωcm, and the first semiconductor region has a depth of 2.0 to 2.2 μm along a depth direction of the semiconductor substrate and an impurity concentration of $1 \times 10^{14}$ to $1 \times 10^{18}/cm^3$.

12 Claims, 21 Drawing Sheets

ND LIQUID
SEMICONDUCTOR DEVICE AND LIQUID JETTING DEVICE USING THE SAME

BACKGROUND OF THE INVENTION

1. Field of the Invention

The present invention relates to a semiconductor device and a liquid jetting device using the same, and more particularly to a liquid jetting device applicable to a recording apparatus used as an output terminal of an information equipment such as a copy machine, a facsimile, a word processor and a computer or applicable to apparatuses to be used for manufacturing a DNA chip, an organic transistor, a color filter and the like, and a semiconductor device suitable for use with such a liquid jetting device.

2. Related Background Art

A liquid jetting device will be described by using as an example a recording apparatus such as an ink jet printer.

A conventional recording apparatus is mounted with as its recording head electrothermal conversion elements and semiconductor devices for driving the electrothermal conversion elements (hereinafter called electrothermal conversion element driving semiconductor devices).

FIG. 19 is a schematic cross sectional view showing a portion of a conventional liquid jetting recording head. Reference numeral 101 represents a semiconductor substrate made of single crystal silicon. Reference numeral 102 represents a p-type well region, 108 represents an n-type drain region, 115 represents an n-type electric field relaxation drain region, 107 represents an n-type source region, and 104 represents a gate electrode, these elements constituting a electrothermal conversion element driving semiconductor device 130 using metal insulator semiconductor (MIS) type field effect transistors.

Reference numeral 117 represents a silicon oxide layer serving as a heat accumulation layer and an insulating layer, 118 represents a tantalum nitride film serving as a heat generating resistor layer, 119 represents an aluminum alloy layer serving as a wiring layer, and 120 represents a silicon nitride layer serving as a protective layer, these elements constituting a main base 140 for a recording head. An area 150 is a heat generating area, and ink is jetted out of a jet port 160. A top plate 170 together with the main base 140 defines a liquid path 180.

Other electrothermal conversion element driving semiconductor devices are disclosed in Japanese Patent Application Laid-Open Nos. 5-185594, 6-069497, 10-034898 and the like.

Apart from the recording head, the known structure of an insulated gate type transistor to be used for applications other than driving the electrothermal conversion elements is described in Japanese Patent Application Laid-Open Nos. 62-098764, 5-129597, 8-097410, 9-307110 and the like.

Many improvements have been made on a recording head having an above-described conventional structure and the above-described electrothermal conversion element driving semiconductor device. Recent products are required to have a higher degree of high speed driving, energy saving, high integration, low cost and high performance. A conventional head structure is insufficient in high density integration of switching elements. A rise in a substrate voltage and latch-up are likely to occur because of a low breakdown voltage in operation.

If an insulated gate type transistor is used for driving an electrothermal conversion element, it is required not only to improve breakdown voltage but also to have a higher degree of high speed driving, energy saving, high integration, low cost and high performance. Under such circumstances, the uniformity of the characteristics of semiconductor devices fabricated at high density integration is insufficient if a conventional general structure of a semiconductor device is incorporated.

SUMMARY OF THE INVENTION

It is a first object of the invention to provide a semiconductor device capable of reducing a chip area occupied by a switching element group having excellent breakdown voltage characteristics and achieving higher integration of an electrothermal conversion element driving semiconductor device, and to a liquid jetting device using such a semiconductor device.

It is a second object of the present invention to provide a semiconductor device capable of higher integration, lowering an occurrence probability of malfunction to be caused by channeling and making uniform the characteristics of transistors, and to a liquid jetting device using such a semiconductor device.

In order to achieve the above-described objects, the invention provides a semiconductor device having a plurality of electrothermal conversion elements and a plurality of switching elements for flowing current through the electrothermal conversion elements, respectively formed on a semiconductor substrate of a first conductivity type, wherein: each of the switching elements is an insulated gate field effect transistor comprising: a first semiconductor region of a second conductivity type opposite to the first conductivity type, the first semiconductor region being formed on a principal surface of the semiconductor substrate; a second semiconductor region of the first conductivity type for providing a channel region, the second semiconductor region being formed adjacent to the first semiconductor region; a source region of the second conductivity type formed in a surface layer of the second semiconductor region; a drain region of the second conductivity type formed in a surface layer of the first semiconductor region; and a gate electrode formed on a gate insulating film on the channel region; and a resistivity of the semiconductor substrate is 5 to 18 Ωcm, and the first semiconductor region has a depth of 2.0 to 2.2 µm along a depth direction of the semiconductor substrate and an impurity concentration of $1 \times 10^{14}$ to $1 \times 10^{18}/cm^3$.

The second semiconductor region is formed adjacent to the semiconductor substrate.

The resistivity of the semiconductor substrate is 5 to 16 Ωcm.

A layout direction of the electrothermal conversion elements is parallel to a layout direction of the switching elements.

The drain regions of at least two insulated gate field effect transistors are connected to each of the electrothermal conversion elements, and the source regions of the at least two insulated gate field effect transistors are connected in common.

An effective channel length of the insulated gate field effect transistor is determined by a difference of lateral impurity diffusion amounts of the second semiconductor region and the source region.

An electrode contact diffusion region of the first conductivity is formed penetrated through the source region.

A portion of the gate electrode on a drain side is formed on an insulating film thicker than the gate insulating film.

A portion of the gate electrode on a drain side is formed on a field insulating film.

A liquid jet port is provided for each of the electrothermal conversion elements.

The electrothermal conversion elements are made of thin film resistors formed on the semiconductor substrate.

In order to achieve the above objects, the invention also provides a liquid ejecting device comprising: the semiconductor device provided with a liquid jet port for each of the electrothermal conversion elements; a liquid container for housing liquid to be ejected out of each liquid jet port by the electrothermal conversion elements; and a controller for supplying a drive control signal which drives the insulated gate field effect transistor of the semiconductor device.

With the above-described structure of this invention, since the drain impurity concentration can be set lower than the channel impurity concentration and the drain can be formed sufficiently deep, it is possible to realize a large current due to a high breakdown voltage, a high speed operation due to a low on-resistance, high integration and energy saving. With the above-described structure of this invention, electric isolation between transistors of a semiconductor device having an array structure of a plurality of transistors can be realized without raising cost.

With the above-described structure of this invention, it is possible to provide transistor arrays having uniform characteristics and high density integration.

By using a novel double diffused MOS transistor as the switching element, the breakdown voltage can be improved while suppressing leak current flowing from the drain to the substrate and suppressing electric field concentration.

DESCRIPTION OF THE PREFERRED EMBODIMENTS

Figure 1:
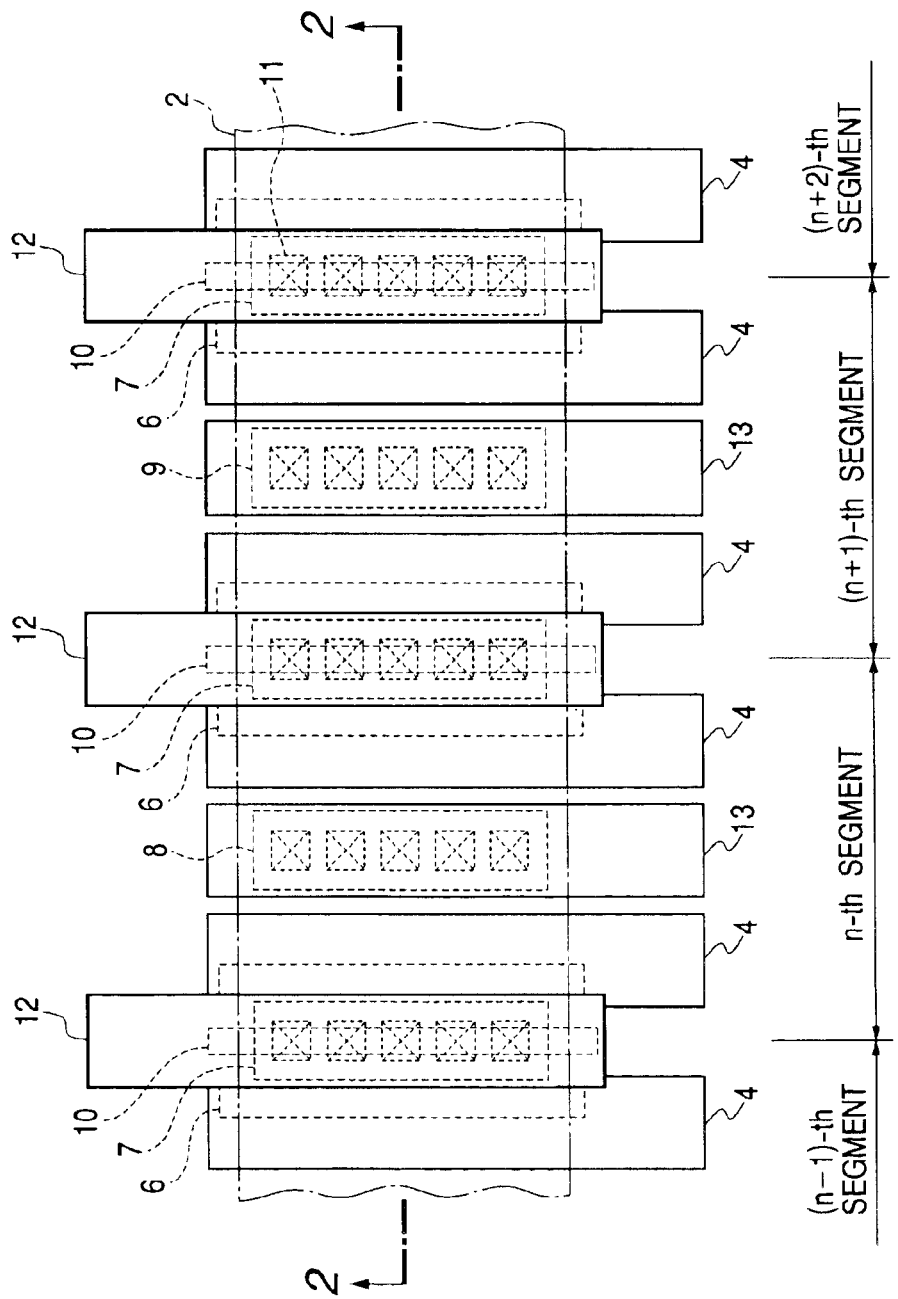
FIG. 1 is a schematic plan view of a semiconductor device according to a first embodiment of the invention.

Embodiments of the invention will be described in detail with reference to the accompanying drawings.

(First Embodiment)

First, with reference to FIGS. 1 to 4, the description will be given on a semiconductor device for a liquid jetting apparatus according to the first embodiment of the invention.

Reference numeral 1 represents a p-type semiconductor substrate, reference numeral 2 represents an n-type well region (first semiconductor region), reference numeral 4 represents a gate electrode, reference numeral 6 represents a p-type base region (second semiconductor region), reference numeral 7 represents an n-type source region, reference numerals 8 and 9 represents an n-type drain region, reference numeral 10 represent a base electrode contact diffusion region, reference numeral 11 represents a contact, reference numeral 12 represents a source electrode, and reference numeral 13 represents a drain electrode. Reference numeral and symbols 30, Tr1, Tr2 and Tr3 represent an insulated gate type field effect transistor to be used as a switching element, reference numerals 31, 32 and 33 represent an electrothermal conversion element to be used as a load, and reference numerals 34, 35 and 36 represent a switch.

The electrothermal conversion elements 31 to 33 are formed being integrated on the principal surface of the semiconductor substrate 1 by using thin film forming processes. Similarly, the switching Tr1 to Tr3 are disposed on the principal surface of the semiconductor substrate 1. If the parallel layout is adopted for the electrothermal element and switching element, the integration can be improved. In this case, the switching elements are preferably disposed in the layout shown in FIGS. 1 to 3. The structures of transistors connected to the electrothermal conversion elements are all the same, and in addition, a dedicated element separation is not used between transistors in a transistor array.

One segment is constituted of two gate electrodes and two source regions with the drain region being interposed therebetween. The source region is shared by an adjacent segment.

Figure 3:
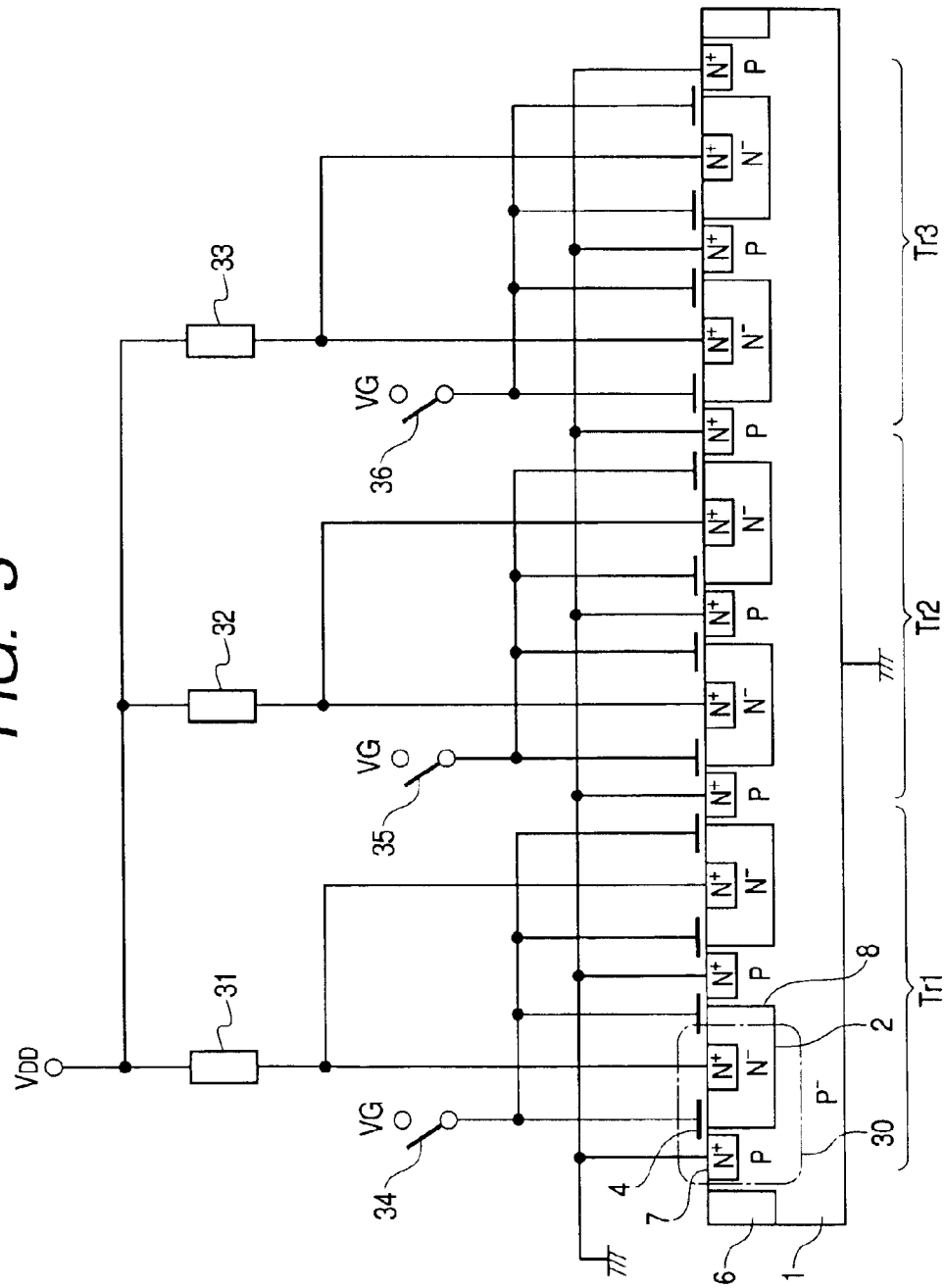
FIG. 3 is a schematic diagram showing the circuit structure of the semiconductor device of the first embodiment.

In the example shown in FIG. 3, the drains of two segments are connected to one end of the electrothermal conversion element, and the common source is connected to a low reference voltage line for supplying a relatively low reference voltage, e.g., 0 V. The other terminal of the electrothermal conversion element is connected to a high reference voltage source VDD for supplying a relatively high reference voltage VH, e.g., about +10 V to +30 V.

The outline of the operation of this semiconductor device will be described. A reference voltage, e.g., a ground potential, is applied to the p-type semiconductor substrate 1 and source region 7. A high reference voltage VH is applied to the other terminal of each of the electrothermal conversion elements 31 to 33. If current is to be flowed through only, e.g., the electrothermal conversion element 31, only the switch 34 is turned on and a gate voltage VG is applied to the gates of the transistors of two segments constituting the switching element Tr1. In this state, current flows from the power terminal to the electrothermal conversion element 31 and switching element Tr1 and to the ground terminal, so that heat is generated in the electrothermal conversion element 31. As well known, this heat is utilized to eject liquid.

Figure 2:
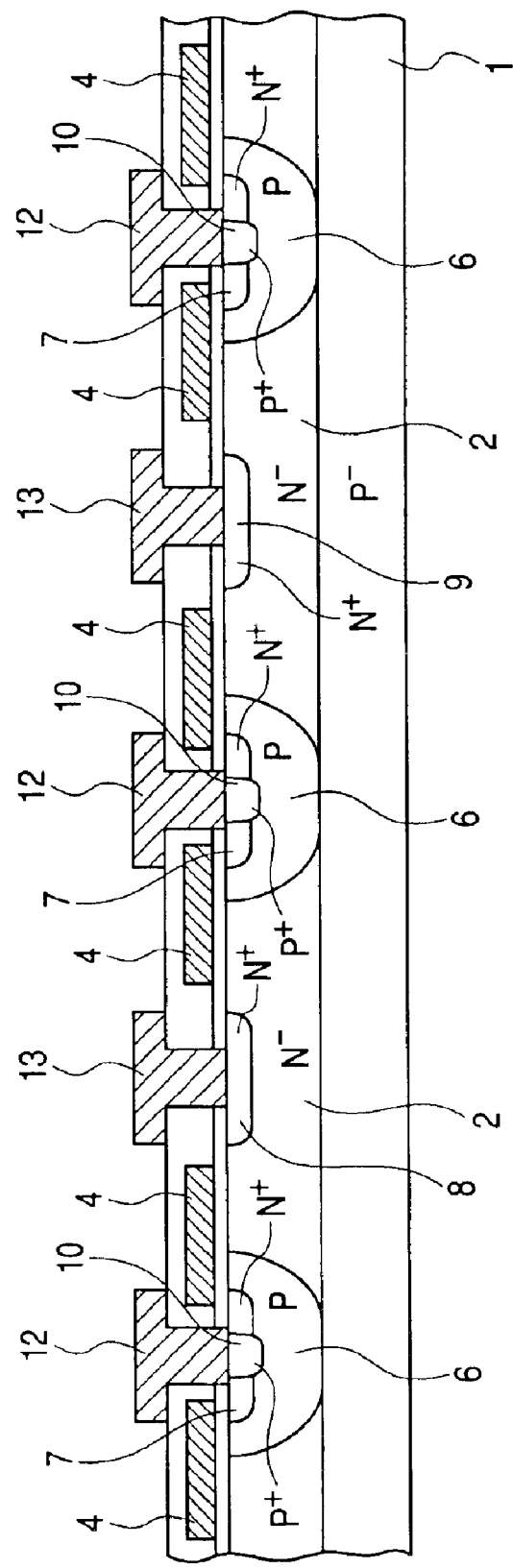
FIG. 2 is a schematic cross sectional view of the semiconductor device of the first embodiment.

In this embodiment, as shown in FIG. 2, the base region 6 is formed in the well region 2 formed in advance sufficiently deep. The well region 2 and base region 6 correspond to the drain and channel of the transistor 30, respectively. A general MOS transistor has the structure that the drain is formed after the channel semiconductor region is formed. Conversely, in this embodiment, since the channel is formed after the drain is formed, it is possible to set the drain impurity concentration (in this example, donor concentration of the first semiconductor region 2) lower than the channel impurity concentration (in this example, acceptor concentration of the second semiconductor region 6). A breakdown voltage of a transistor is determined by a breakdown voltage of the drain, and the lower the drain impurity concentration and the deeper the drain, the transistor breakdown voltage becomes higher. A practical product preferably satisfies a rated breakdown voltage of 20 to 30 V. In order to satisfy this rated voltage, it is desired that the acceptor concentration of the second semiconductor region 6 is set to $1 \times 10^{15}$ to $1 \times 10^{19}/cm^3$, that the donor concentration of the first semiconductor region 2 is set to $1 \times 10^{14}$ to $1 \times 10^{18}/cm^3$ and that the depth is set to about 2.0 to 2.2 $\mu m$. With this settings, a rated voltage can be set high and large current and high speed operation can be realized as in this embodiment.

An effective channel length-of the transistor 30 of this embodiment is determined by a difference between impurity lateral diffusion amounts of the base region 6 and source region 7. Since the lateral diffusion amount is determined by physical coefficients, the effective channel length can be made shorter than a conventional length so that the on-resistance can be reduced. Reduction in the on-resistance results in a large current amount per unit size and in high speed operation, energy saving and high integration.

Two gate electrodes 4 are disposed sandwiching the source region 7. The base region 6 and source region 7 can be formed in a self-alignment manner by using the gate electrodes 4 as a mask, as will be later described. A size error by alignment does not occur and threshold values of transistors 30 can be suppressed to a low variation, resulting in high yield and high reliability.

Each semiconductor region will be further detailed. As described above, the depth of the well region 2 determines the breakdown voltage of the drain region and eventually the breakdown voltage of the switching transistor. If the transistor is to be used as the switching element of a liquid jetting device, it is preferable to form the well region among other regions as deep as possible. If the well region 2 is formed too deep, there is associated with the problem of a narrow margin of setting the conditions of forming the base region. Although the base region is required to be deeper than the depth of the well region 2 in order to electrically isolate adjacent elements, if the base region is made deep, there is a problem of lateral diffusion and the channel control becomes difficult. From this point of view, the base region depth has been studied.

Figure 20:
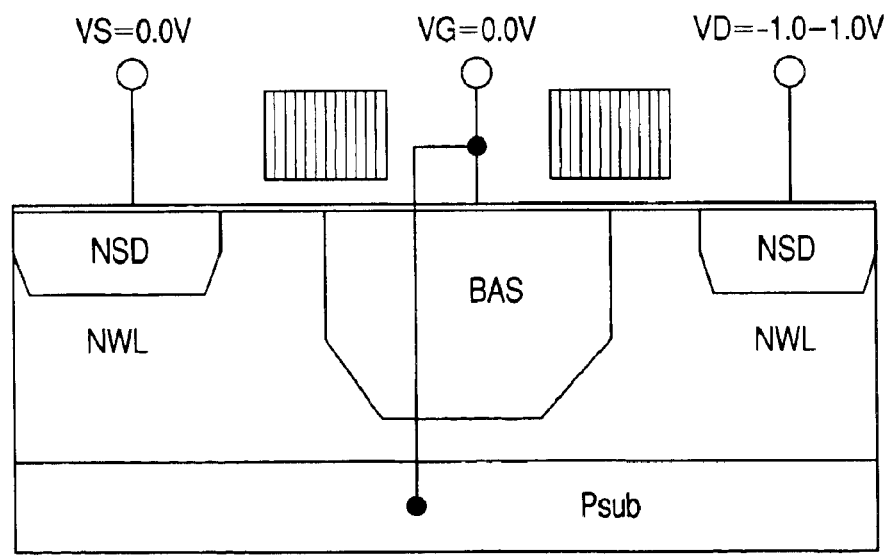
FIG. 20 is a diagram illustrating a method of measuring the relation between JFET_Vth and BASR.
Figure 21:
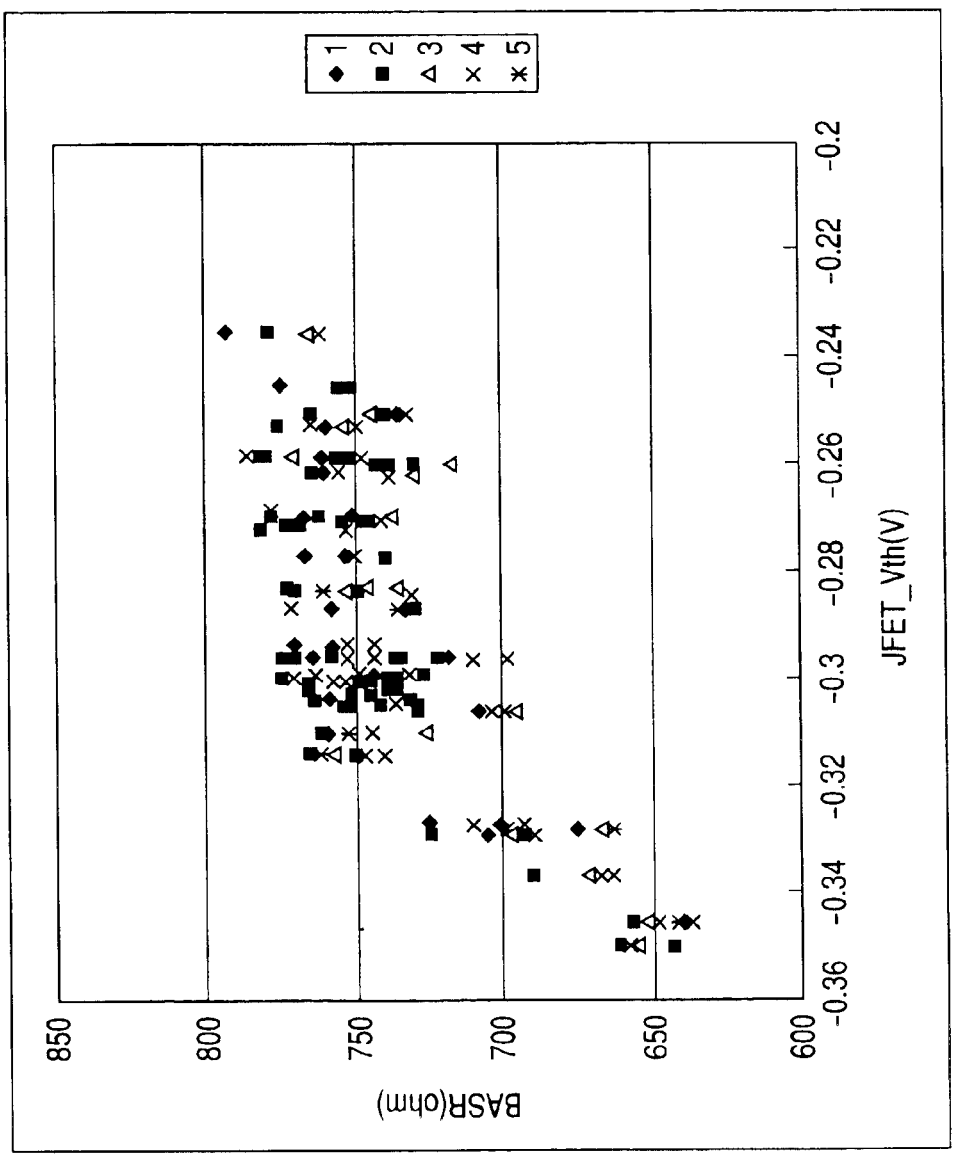
FIG. 21 is a graph showing the measurement results by the method illustrated in FIG. 20.

If at least the depth of the well region 2 is much deeper than that of the base region, the well region exists between the base region and substrate. Paying attention to this fact, a junction type FET pretending the base region as a gate electrode as shown in FIG. 20 was prepared to measure the relation between a base region resistance (BASR) and a drain voltage (JFET_Vth). The measurement results are shown in FIG. 21. In this case, BASR was measured as the resistance between the base region and substrate. BASR can therefore be changed with the base region depth.

As seen from FIG. 21, a change amount of BASR becomes small starting from neat at JFET_Vth=−0.32 V. This may be ascribed to that the depth of the well region is approximately equal to that of the base region. Namely, the drain and source are completely separated by the base region and the transistor cannot operate as the junction FET. BASR in this state is near at 750Ω. It can therefore be said that the base region can electrically separate adjacent regions if the depth is set so that at least BASR is 750Ω or lower.

Separation from adjacent regions can be achieved even if BASR is larger than 750Ω, depending upon a drive method for a switching element. Namely, a bias is applied to make deplete the region between the well region and substrate under the practical use conditions. In this case, the depleted region between the well region and substrate can isolate adjacent regions. In order to investigate BASR in the case wherein the depleted region realizes electrical isolation although the base region itself cannot realize perfect electrical isolation, resistances between BAS-SUB of samples with BASR 750Ω and samples with BASR 760 and 830Ω were prepared and evaluated by a measurement method such as shown in FIG. 22.

Figure 22:
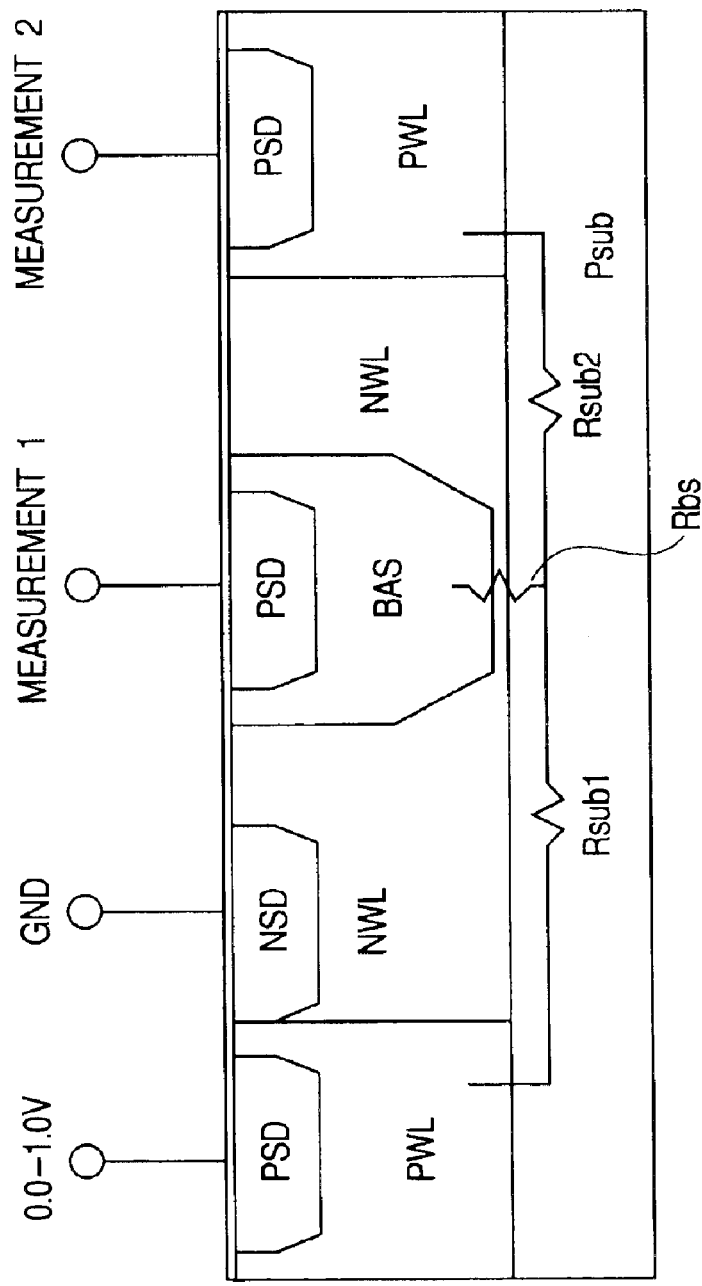
FIG. 22 is a diagram illustrating a method of measuring and evaluating a resistance between BAS and SUB.
Figure 23:
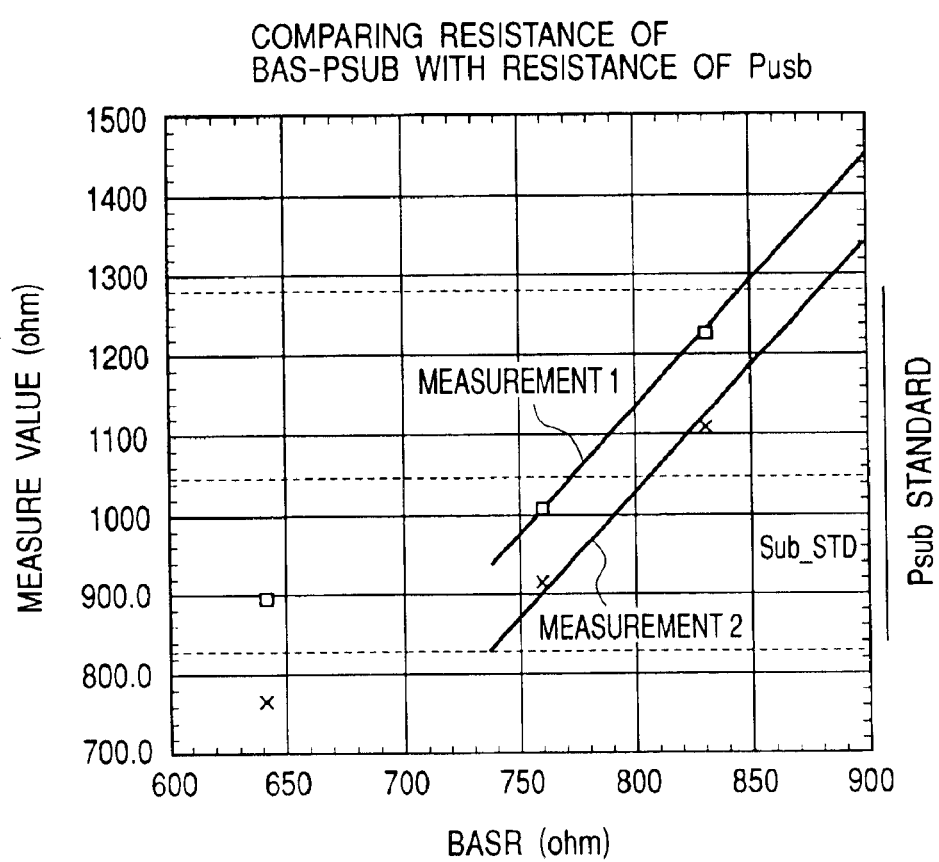
FIG. 23 is a graph showing the measurement results by the method illustrated in FIG. 22.

In a graph shown in FIG. 23, the abscissa represents BASR and the ordinate represents a resistance value measured at each of measure points 1 and 2 shown in FIG. 22. BASR of the abscissa was changed by controlling the impurity concentration of the substrate. From the measurement results at the measure points 1 and 2, it can be understood that Rbs<<Rsub. This means that a large resistance increase to be caused by a severe change in the structure under the base region is not observed in the samples with BASR of 830Ω or lower. Namely, it means that electrical separation is not realized by the depleted region under the practical use conditions. It is therefore possible to use samples with BASR of at least 830Ω or lower under the practical use conditions without any problem.

Figure 24:
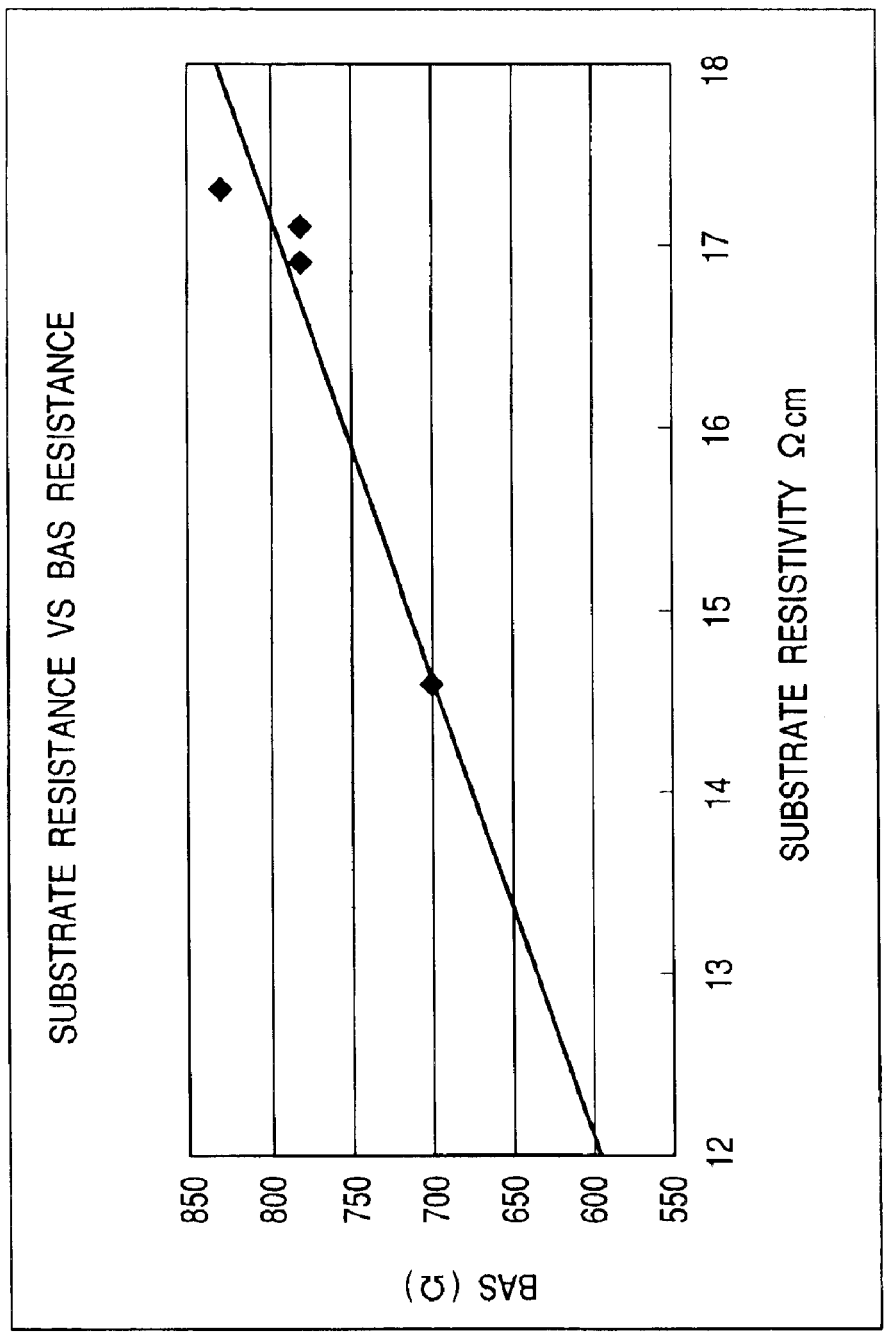
FIG. 24 is a graph showing the measurement results of a relation between a substrate resistivity and BASR.

Next, the description will be given on the relation between the substrate resistivity and BASR shown in the abscissa in FIG. 23. The substrate resistivity was measured by using a wafer subjected to the JFET_Vth measurement. It was confirmed from the measurements that as the substrate resistivity lowered, BASR also lowered. This may be ascribed to that the substrate resistivity is related to the depth of a well region. Namely, in the range of a high substrate resistivity, there is a tendency that the well region becomes deeper, whereas in the range of a low substrate resistivity, there is a tendency that the well region becomes shallower. Therefore, assuming that the manufacture conditions are constant, the depth of the well region is determined by the substrate resistivity (impurity concentration). Under the constant manufacture conditions, the relation between the substrate resistivity and the base region resistance (BASR) was measured, the results being shown in FIG. 24. It was found from FIG. 24 that in order to satisfy the above-described range of BASR, it is desired to set the substrate resistivity to 5 Ωcm used generally or higher and 18 Ωcm or lower. It is more preferable that the substrate resistivity is 16 Ωcm or lower at which perfect electrical isolation by the base region can be realized.

In summary, a high rated voltage, large current, high speed operation, and appropriate electrical isolation of adjacent regions in a semiconductor device to be used by a liquid jetting device can be realized assuming that the rated voltage is set to 20 to 30 V, the depth of first semiconductor region is set to 2.0 to 2.2 $\mu$m, its impurity concentration is set to $1 \times 10^{14}$ to $1 \times 10^{18}/cm^3$ and the substrate resistivity is set to 5 to 18 Ωcm.

Since the electrode contact diffusion region 10 is formed penetrating through the source region 7, it is possible to maintain the source region 2 at a predetermined potential without increasing the occupied chip area.

Figure 4:
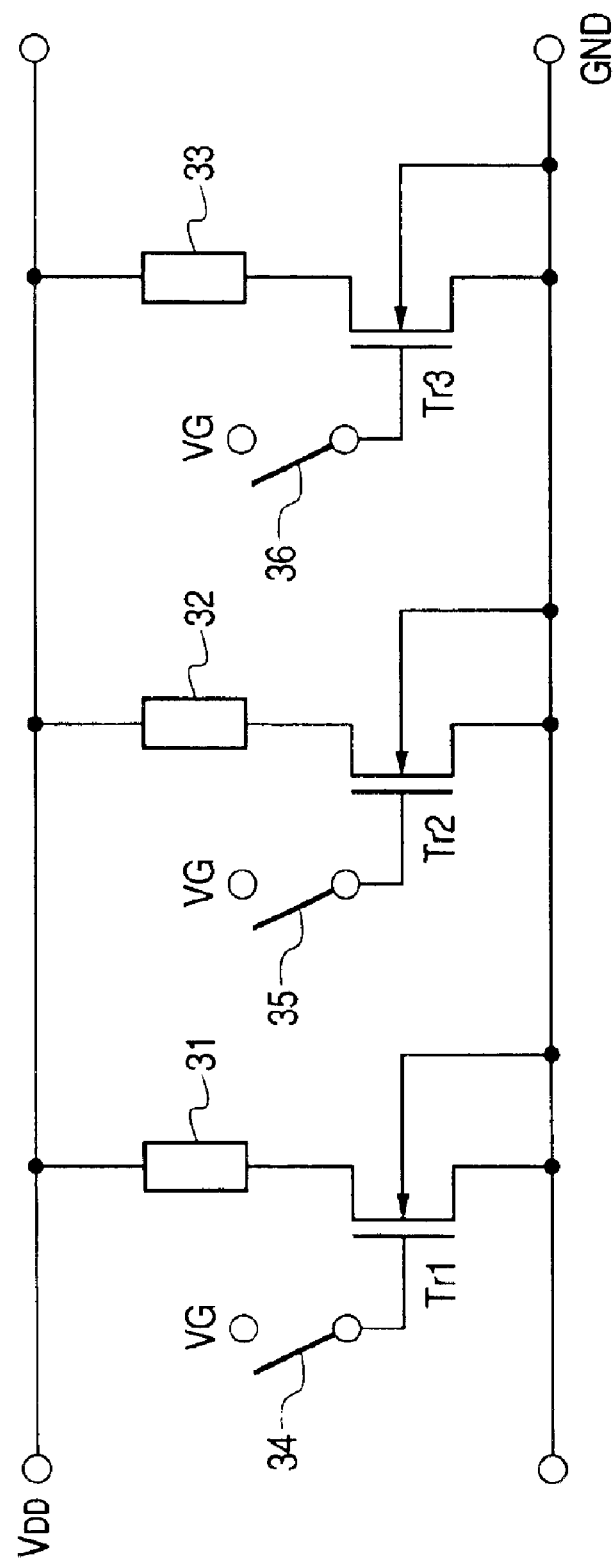
FIG. 4 is a circuit diagram of the semiconductor device of the first embodiment.

In the circuit arrangement shown in FIGS. 3 and 4, two drains (two segments) of the transistors 30 connected in parallel are connected to one load which is able to be driven independently. When an on-signal for driving the load is applied to the gate, the transistor turns on and current flows from the single drain to the common source via the channels on both sides of the drain. As described earlier, the source at the boarder between adjacent segments is used in common by the adjacent segments. When transistors of this embodiment are disposed in an array and used with a liquid jetting device, a dedicated element separation region made of pn junction separation semiconductor, LOCOS or trench separation dielectric or the like is not necessary to be formed between adjacent transistors. A highly integrated semiconductor device capable of flowing large current can be formed with a simple layer structure such as shown in FIGS. 2 and 3 and with low cost.

Further, leak current flowing from the drain to the p-type semiconductor substrate 1 can be sufficiently suppressed.

(Second Embodiment)

The fundamental structure of a semiconductor device to be used with a liquid jetting device according to the second embodiment of the invention is the same as that of the first embodiment. Different points from the first embodiments reside in the positions of drain regions 8 and 9 and the manufacture method.

Figure 5:
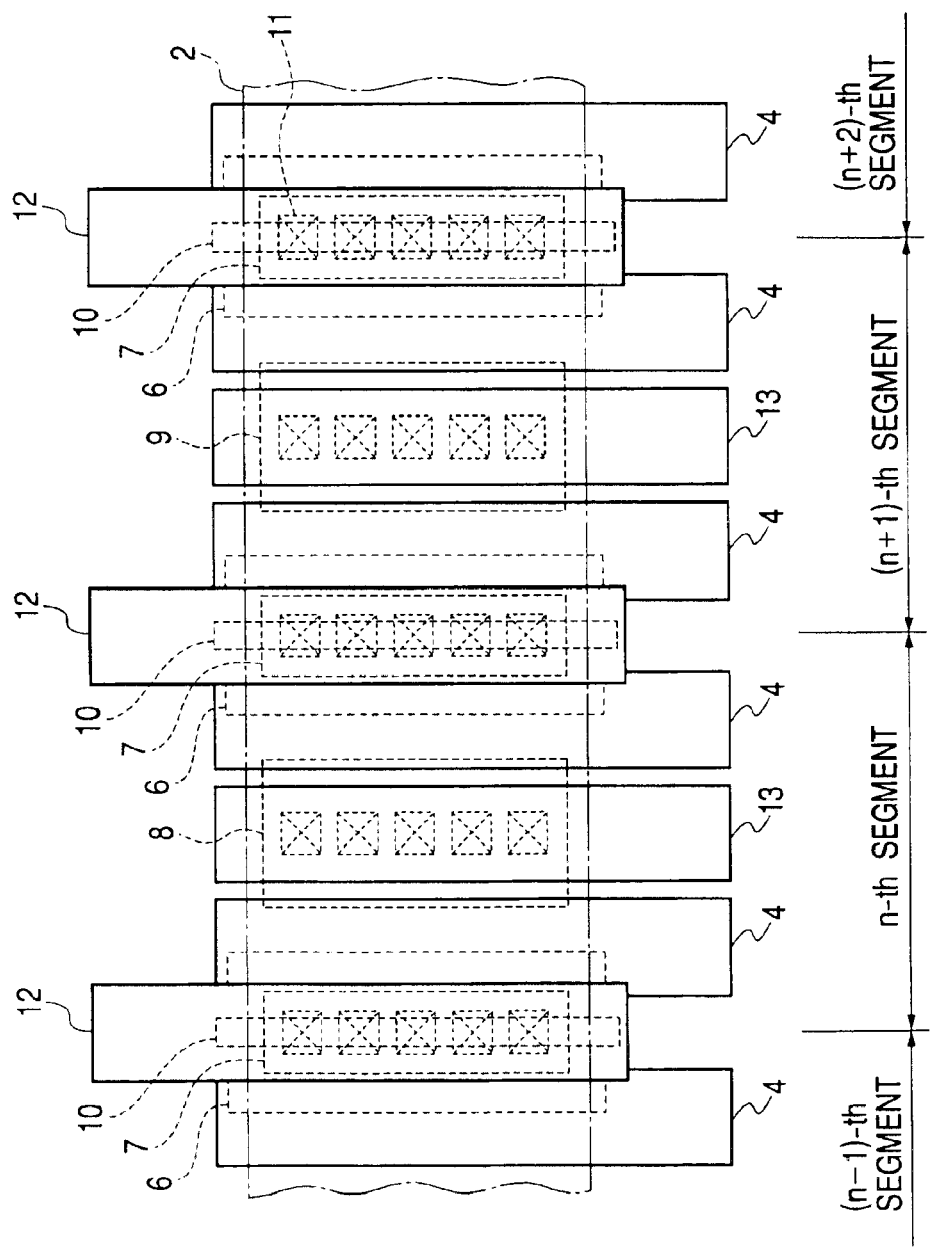
FIG. 5 is a schematic plan view of a semiconductor device according to a second embodiment of the invention.

FIG. 5 is a plan view of the semiconductor device for a liquid jetting deice of the second embodiment, and FIGS. 6A to 6F are cross sectional views thereof.

Figure 6A:
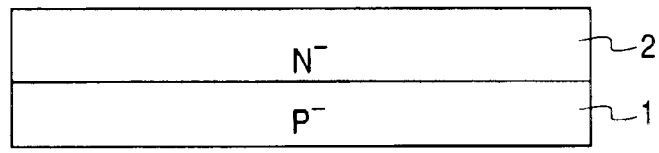
FIGS. 6A, 6B, 6C, 6D, 6E and 6F are schematic cross sectional views illustrating the manufacture processes for the semiconductor device of the second embodiment.
Figure 6B:
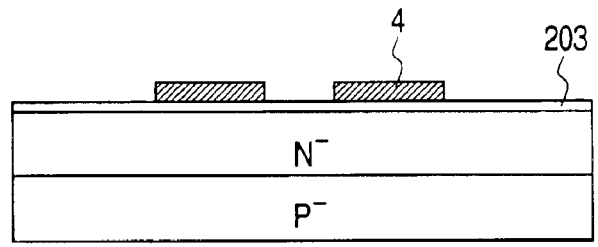
Figure 6C:
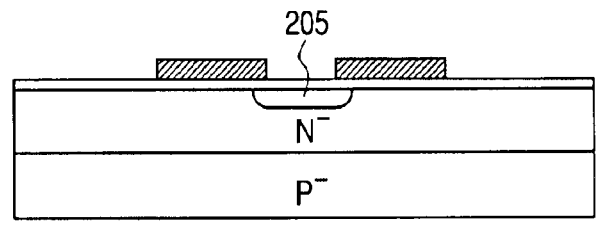
Figure 6D:
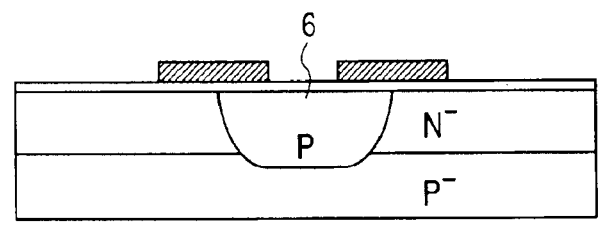
Figure 6E:
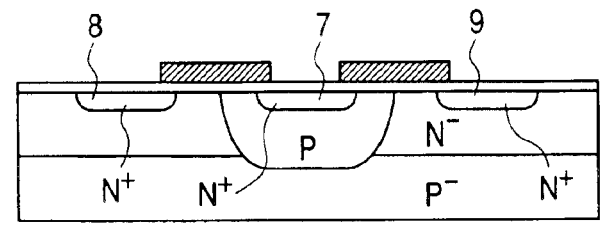

A method of manufacturing a semiconductor device having a plurality of electrothermal conversion elements and a plurality of switching elements to be used to flow current through the electrothermal conversion elements, respectively integrated on a semiconductor substrate of a first conductivity type, comprises: a step of forming a semiconductor layer 2 of a second conductivity type opposite to the first conductivity type on a principal surface of the semiconductor substrate 1 of the first conductivity type (FIG. 6A); a step of forming a gate insulating film 203 on the semiconductor layer and gate electrodes 4 on the gate insulating film (FIG. 6B); a step of doping impurities of the first conductivity type by using the gate electrodes as a mask (FIG. 6C); a step of diffusing the impurities of the first conductivity type into the semiconductor layer of the second conductivity type under the conditions satisfying the conditions of the first embodiment to form a semiconductor region 6 (FIG. 6D); and a step of forming a source region 7 of the second conductivity type in a surface layer of the semiconductor region 6 by using the gate electrodes as a mask and forming drain regions 8 and 9 of the second conductivity type in a surface layer of the semiconductor layer 2 of the second conductivity type (FIG. 6E). This method will be detailed in the following.

First, as shown in FIG. 6A, a p-type semiconductor substrate 1 having a resistivity of 5 to 18 Ωcm is prepared and n-type impurities are selectively implanted into a region where a well is to be formed. An n-type well region 2 is therefore formed in the surface layer of the p-type semiconductor substrate 1. The conditions of forming the well region are an annealing process for 60 minutes at 1100° C. The n-type well region 2 may be formed over the whole surface of the p-type semiconductor substrate 1. In this case, epitaxial growth may be used.

Next, as shown in FIG. 6B, on the n-type well region 2, a gate oxide film (gate insulating film) 203 is grown to a thickness of about 50 nm by hydrogen burning oxidation for example. On the gate oxide film 203, polysilicon is deposited to a thickness of about 300 nm by low pressure chemical vapor deposition (LPCVD) for example. At the same time when polysilicon is deposited or after the deposition, for example, phosphorous is doped by ion implantation or solid phase diffusion, to thereby obtain a desired wiring resistance value. Thereafter, the polysilicon film is patterned by photolithography and etched to form gate electrodes 4 of MIS field effect transistors.

Next, as shown in FIG. 6C, an ion implantation mask (not shown) of photoresist is formed by photolithography. By using the gate electrodes 4 and ion implantation mask as a mask, p-type impurities, e.g., boron ions, are selectively implanted to form an impurity layer 205.

Next, as shown in FIG. 6D, heat treatment is performed in an electric furnace for 60 minutes at 1100° C. to form a base region 6 having a depth of 2.0 to 2.2 $\mu$m. In this embodiment, it is important to design in such a manner that the base region 6 has a depth equal to or deeper than that of the well region 2. The above heat treatment conditions were applied to the case that the well region 2 was 2.0 to 2.2 $\mu$m deep and the impurity concentration was about $1 \times 10^{15}$ to $1 \times 10^{19}/cm^3$.

Next, as shown in FIG. 6E, by using the gate electrodes 4 as a mask, for example, arsenic ions are implanted to form a source region 7, a first drain region 8 and a second drain region 9. The source region 7 and drain regions 8 and 9 are formed in self-alignment with the gate electrodes and slightly overlapped.

Figure 6F:
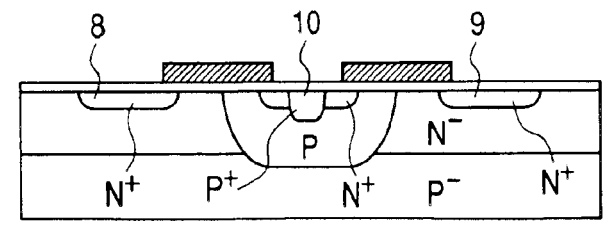

Next, as shown in FIG. 6F, a photoresist mask (not shown) is formed by photolithography. By using the photoresist mask as a mask, for example, ions are implanted to form a base electrode contact diffusion layer 10. Although this base electrode contact diffusion layer 10 is not necessarily required, the existence of this layer is preferable from the view point of circuit design. Even if the diffusion layer 10 is formed, the number of processes will not increase if p-type MIS field effect transistors for a signal processing circuit are formed at the same time. Thereafter, heat treatment is performed, for example, for 30 minutes at 950° C. to activate the source region 7, first and second drain regions 8 and 9 and base electrode contact diffusion layer 10.

Thereafter, although not shown, an oxide film is deposited by chemical vapor deposition (CVD) to form an interlayer insulating film. Contact holes for contacts 11 (refer to FIG. 5) are formed and conductor is deposited and patterned to form wiring lines. If necessary, multilayer wiring lines are formed to complete an integrated circuit device.

Electrothermal conversion elements are formed by known thin film processes during the wiring line forming process and integrated on the substrate 1. The circuit arrangement is the same as that of the first embodiment.

In this embodiment, since the gate electrodes 4 are used as the ion implantation mask to form the base region 6, source region 7 and drain regions 8 and 9, these regions can be formed in alignment with the gate electrodes 4. It is therefore possible to achieve high integration of a switching element array and uniformity of the characteristics of respective elements. Since the source region 7 and drain regions 8 and 9 can be formed by the same process, manufacture cost can be suppressed.

(Third Embodiment)

If the breakdown voltage of a drain region is desired to improve further, as shown in FIGS. 1 and 2, it is preferable to form the sides of the drain regions 8 and 9 spaced apart from the sides of the gate electrode. Such a semiconductor device can be manufactured by a method to be described later, without increasing the number of photolithography processes.

Figure 7:
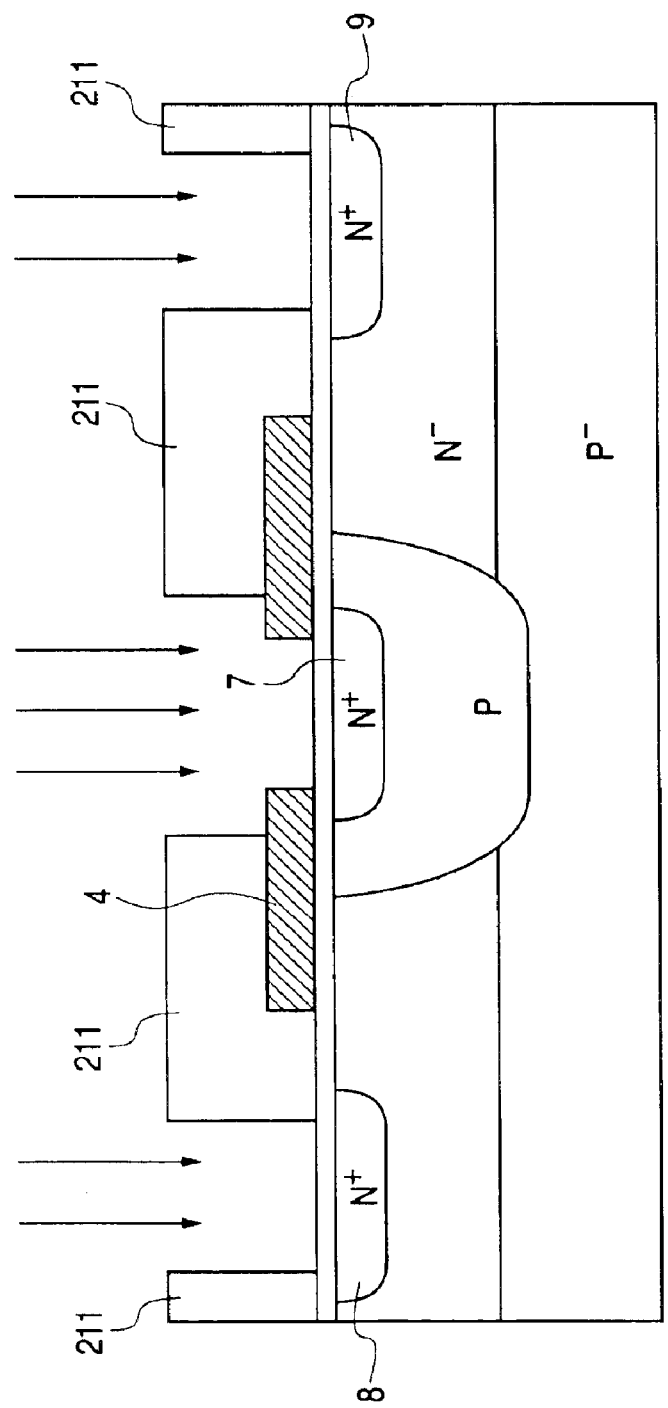
FIG. 7 is a schematic cross sectional view illustrating the manufacture processes for a semiconductor device according to a third embodiment of the invention.

FIG. 7 is a cross sectional view illustrating a method of manufacturing a semiconductor device according to the third embodiment of the invention. This semiconductor manufacture method after the processes shown in FIGS. 6A to 6D will be described.

As shown in FIG. 7, a photoresist mask is formed patterned by photolithography. By using the photoresist mask 211 and gate electrodes 4 as a mask, for example, arsenic ions are implanted to form a source region 7, a first drain region 8 and a second drain region 9. It is important that the photoresist mask 211 is formed to make the first and second drain regions 8 and 9 have an offset from the gate electrodes 4. It is therefore possible to have a sufficient distance between the source and drain and to prevent a breakdown voltage from being lowered by electric field concentration, because a high impurity concentration diffusion layer does not exist just under the gate electrodes.

Thereafter, the process shown in FIG. 6F and other necessary processes are performed to complete an integrated circuit having electrothermal conversion elements similar to the second embodiment.

(Fourth Embodiment)

With reference to FIGS. 8A to 8G, the description will be made on a method of manufacturing a semiconductor device according to the fourth embodiment of the invention. The feature of this embodiment resides in that a gate electrode 4 on the drain side is formed on an insulating film thicker than the gate insulating film.

Figure 8A:
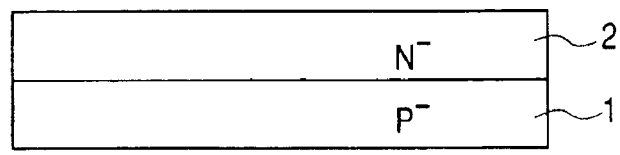
FIGS. 8A, 8B, 8C, 8D, 8E, 8F and 8G are schematic cross sectional views illustrating the manufacture processes for a semiconductor device according to a fourth embodiment of the invention.
Figure 8B:
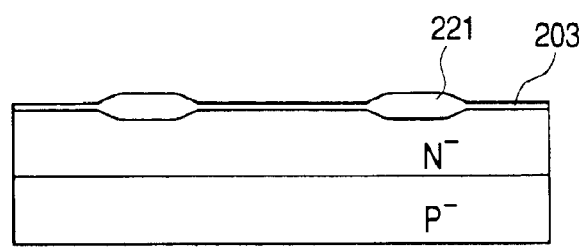
Figure 8C:
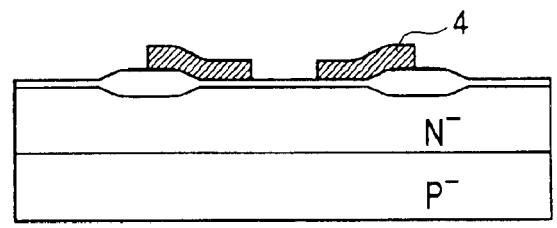
Figure 8D:
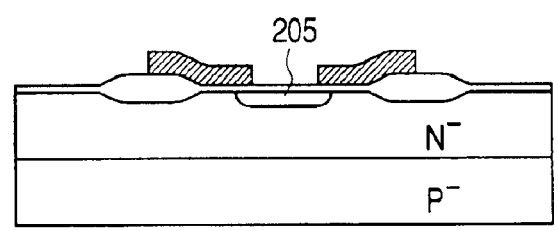
Figure 8E:
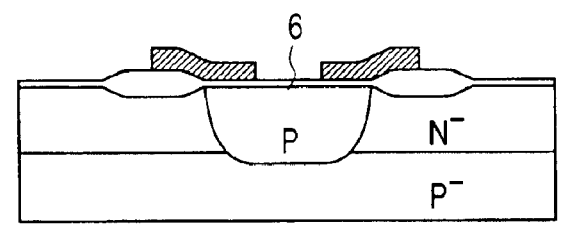
Figure 8F:
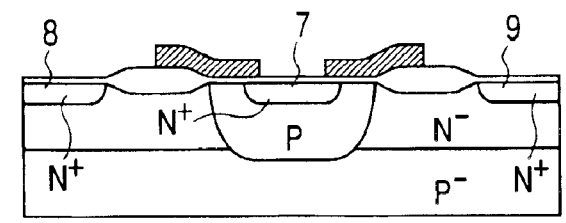

In this embodiment, a method of manufacturing a semiconductor device having a plurality of electrothermal conversion elements and a plurality of switching elements to be used to flow current through the electrothermal conversion elements, respectively integrated on a semiconductor substrate of a first conductivity type, comprises: a step of forming a semiconductor layer 2 of a second conductivity type opposite to the first conductivity type on a principal surface of the semiconductor substrate 1 (FIG. 8A); a step of selectively forming a field insulating film 221 on the semiconductor layer (FIG. 8B); a step of forming a gate insulating film 203 on the semiconductor layer (FIG. 8B); a step of forming gate electrodes 4 on the gate insulating film and field insulating film (FIG. 8C); a step of doping impurities of the first conductivity type by using the gate electrodes as a mask (FIG. 8D); a step of diffusing impurities of the first conductivity type to a depth equal to or deeper than a depth of the semiconductor layer of the second conductivity type to form a semiconductor region 6 (FIG. 8E); and a step of forming a source region 7 of the second conductivity type in a surface layer of the semiconductor region 6 by using the gate electrodes as a mask and forming drain regions 8 and 9 of the second conductivity type in a surface layer of the semiconductor layer of the second conductivity type by using the field insulating film as a mask (FIG. 8F). This method will be detailed in the following.

First, as shown in FIG. 8A, an n-type well region 2 is formed on the surface of a p-type semiconductor substrate 1 having a resistivity of 5 to 18 Ωcm.

Next, on the surface of the well region 2, a pad oxide film (not shown) is grown to a thickness of about 10 nm, for example, by hydrogen burning oxidation. On the pad oxide film, a silicon nitride film (not shown) is deposited to a thickness of about 150 nm, for example, by LPCVD. The silicon nitride film is patterned by photolithography and etched. Thereafter, a field oxide film 221 is selectively grown to a thickness of about 500 nm, for example, by hydrogen burning oxidation. Thereafter, the silicon nitride film is completely removed by using, for example, phosphoric acid, and then the pad oxide film is removed by using, hydrogen fluoride acid at about 10 wt %. Thereafter, a gate oxide film 203 is grown on the n-type well region 2 to a thickness of about 10 nm, for example, by hydrogen burning oxidation. Although the pad oxide film itself may be used as the gate oxide film, this is not preferable in terms of reliability of the oxide film. In this manner, as shown in FIG. 8B, the gate oxide film 203 as a thin oxide film and the field oxide film (field insulating film) 221 as a thick oxide film are formed at desired positions of the n-type well region 2.

Next, as shown in FIG. 8C, on the gate oxide film 203 and field oxide film 221, polysilicon is deposited to a thickness of about 300 nm by LPCVD for example. At the same time when polysilicon is deposited by LPCVD or after the deposition, for example, phosphorous is doped by ion implantation or solid phase diffusion, to thereby obtain a desired wiring resistance value. Thereafter, as shown in FIG. 8C the polysilicon film is patterned by photolithography and etched in such a manner that one end of the patterned shape terminates on the gate oxide film 203 and the other end thereof terminates on the field oxide film 221. Gate electrodes 4 of MIS field effect transistors are therefore formed.

Next, as shown in FIG. 8D, an ion implantation mask (not shown) of photoresist is formed by photolithography. By using the gate electrodes 4 and ion implantation mask as a mask, p-type impurities, e.g., boron ions, are selectively implanted to form an impurity layer 205.

Next, as shown in FIG. 8E, heat treatment is performed in an electric furnace for 60 minutes at 1100° C. to form a base region 6. In this embodiment, it is important to design in such a manner that the base region 6 has in the vertical direction a depth equal to or deeper than that of the well region 2. It is also desired to design in such a manner that the opposite ends of the base region 6 are positioned in the horizontal direction at the border between the gate oxide film 203 and field oxide film 221.

The reason for such a layout will be described in the following. If the base region 6 reaches only the intermediate position of the gate oxide film 203, an electric field under the gate electrode is concentrated upon the thin gate oxide film 203 and the gate oxide film 203 may be destructed. If the base region 6 reaches the thick portion of the field oxide film 221, the base region 6 under the thick field oxide film will not inverted even if a predetermined voltage is applied to the gate electrode 4, so that the switching function of the MIS field effect transistor cannot be obtained. Even if the switch can be turned on, its drive capacity lowers.

The heat treatment conditions should therefore be determined in accordance with the depth, impurity concentration and type of impurities respectively of the well region 2 and the impurity concentration and type of impurities respectively of the impurity layer 205, and the mask size.

Next, as shown in FIG. 8F, by using the gate electrodes as a mask, for example, arsenic ions are implanted to form a source region 7, a first drain region 8 and a second drain region 9. The gate electrodes 4 function as a mask for defining the ends of the source region 7. The source region 7 is formed in self-alignment with the gate electrodes 4, and the drain regions 8 and 9 are formed in self-alignment with the field oxide film 221.

Figure 8G:
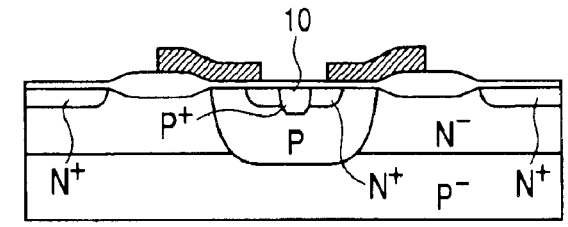

Next, as shown in FIG. 8G, a photoresist mask (not shown) is formed by photolithography. By using the photoresist mask and the gate electrodes as a mask, for example, ions are implanted to form a base electrode contact diffusion layer 10. Although this base electrode contact diffusion layer 10 is not necessarily required, the existence of this layer is preferable from the view point of circuit design. Even if the diffusion layer 10 is formed, the number of processes will not increase if p-type MIS field effect transistors for a signal processing circuit are formed at the same time. Thereafter, heat treatment is performed, for example, for 30 minutes at 950° C. to activate the source region 7, first and second drain regions 8 and 9 and base electrode contact diffusion layer 10. In this manner, by forming the field oxide film 221 under the gate electrode 4 where an electric field is concentrated, the breakdown voltage between the gate and drain of the MIS field effect transistor can be improved. If complementary MIS field effect transistors necessary for high speed operation are required to be formed on the same substrate on which MIS field effect transistors necessary for high breakdown voltage are formed, the field oxide film 221 can be formed at the same time when an element isolation region for complementary MIS field effect transistors is formed, without using an additional process.

Thereafter, although not shown, similar to the embodiment described previously, an oxide film is deposited by CVD to form an interlayer insulating film. Contact holes for contacts 11 (refer to FIG. 1) are formed and conductor is deposited and patterned to form wiring lines. If necessary, multilayer wiring lines are formed to complete an integrated circuit device. Electrothermal conversion elements are formed by known thin film processes during the wiring line forming process and integrated on the substrate 1. The circuit arrangement is the same as that of each of the embodiments.

(Fifth Embodiment)

Figure 9:
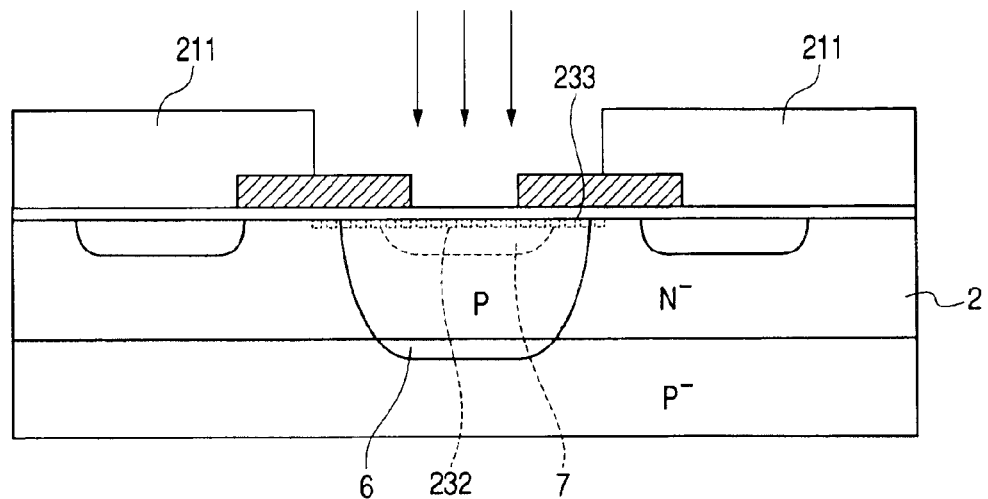
FIG. 9 is a schematic cross sectional view illustrating the manufacture processes for a semiconductor device according to a fifth embodiment of the invention.

FIG. 9 is a diagram to be used for describing a method of manufacturing a semiconductor device according to the fifth embodiment of the invention. This semiconductor device manufacture method after the processes shown in FIGS. 6A to 6D will be described.

As shown in FIG. 9, a photoresist mask 211 is formed patterned by photolithography. By using the photoresist mask 211 as an ion implantation mask, for example, boron ions are implanted at an acceleration energy of 120 keV to form a channel dope layer 232. It is important that the channel dope layer 232 is formed at least in an area of a channel 233 between the well region 2 and the source region 7 (to be formed at a later process) in the base region 6.

The photoresist mask 211 shown in FIG. 9 is not necessarily required, but ions may be implanted into the whole substrate surface. However, if the impurity concentration of the well region 2 is very low, it is preferable to use the photoresist mask 211. The process of forming the channel dope layer 232 is not required to be performed at this stage, but it may be performed at anytime between the base region 6 forming process and the last activation annealing process. In this manner, the channel region 233 can be designed to have a desired impurity concentration so that the threshold value of the MIS field effect transistor can be controlled.

Thereafter, the process shown in FIG. 6E and other necessary processes are performed to complete an integrated circuit having electrothermal conversion elements.

(Sixth Embodiment)

Figure 10:
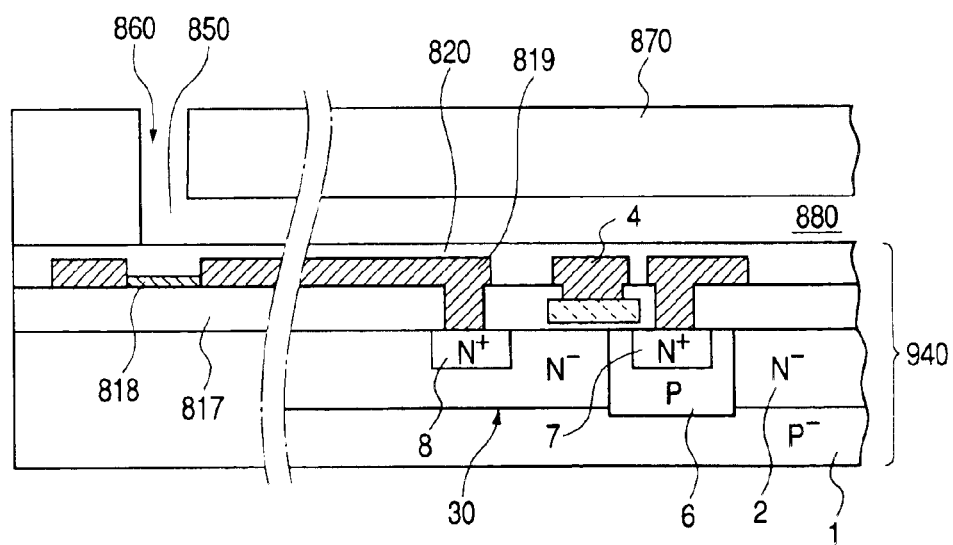
FIG. 10 is a schematic cross sectional view showing an example of the structure of a liquid jetting head using a semiconductor device of this invention.

FIG. 10 is a schematic cross sectional view showing an example of a partial cross sectional structure of an ink jet recording head of a liquid jetting device which is mounted with the semiconductor device manufactured by each manufacture method described with reference to FIGS. 1 to 9. In FIG. 10, reference numeral 1 represents a semiconductor substrate made of single crystal silicon. Reference numeral 2 represents a n-type well region, reference numeral 4 represents a gate electrode, reference numeral 6 represents a p-type base region, reference numeral 7 represents an n-type source region, and reference numeral 8 represents an n-type drain region, these constituting a metal insulator semiconductor (MIS) field effect transistor 30. As described earlier, it is preferable to dispose transistors (segments) in an array shape without forming an element isolation region between adjacent transistors.

Reference numeral 817 represents an insulating layer of silicon oxide or the like serving as a heat accumulation layer and an insulating layer, reference numeral 818 represents a heat generating resistor layer of tantalum nitride, tantalum silicon nitride or the like, reference numeral 819 represents a wiring layer of aluminum alloy or the like, reference numeral 820 represents a passivation layer of silicon nitride or the like, these elements constituting a main base 940 of the recording head. An area 850 is a heat generating area, and ink is jetted out of a jet port 860. A top plate 870 together with a main base 940 defines a liquid path 880.

An operation of each embodiment of the invention described above will be described.

Figure 11:
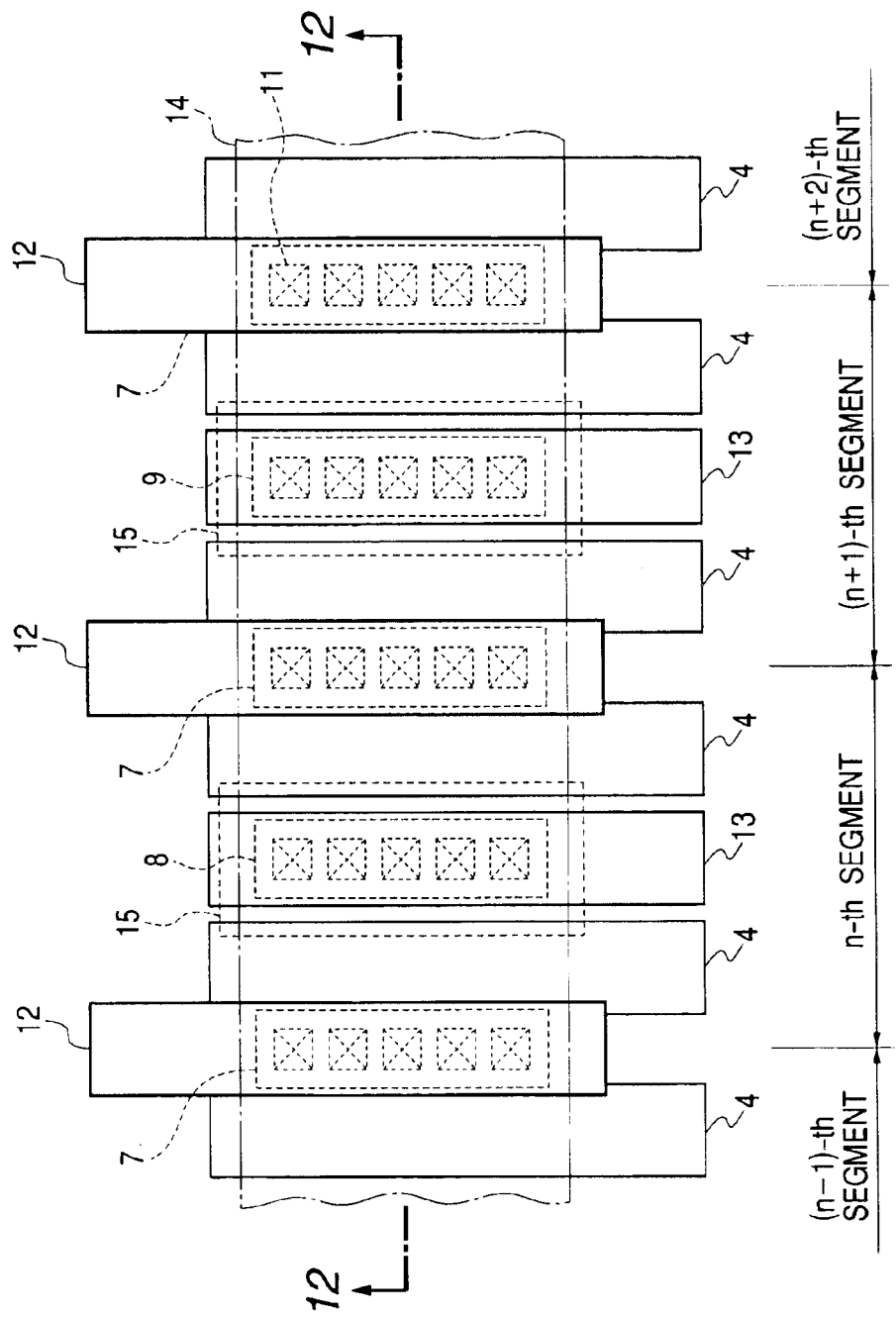
FIG. 11 is a schematic plan view of a semiconductor device.
Figure 12:
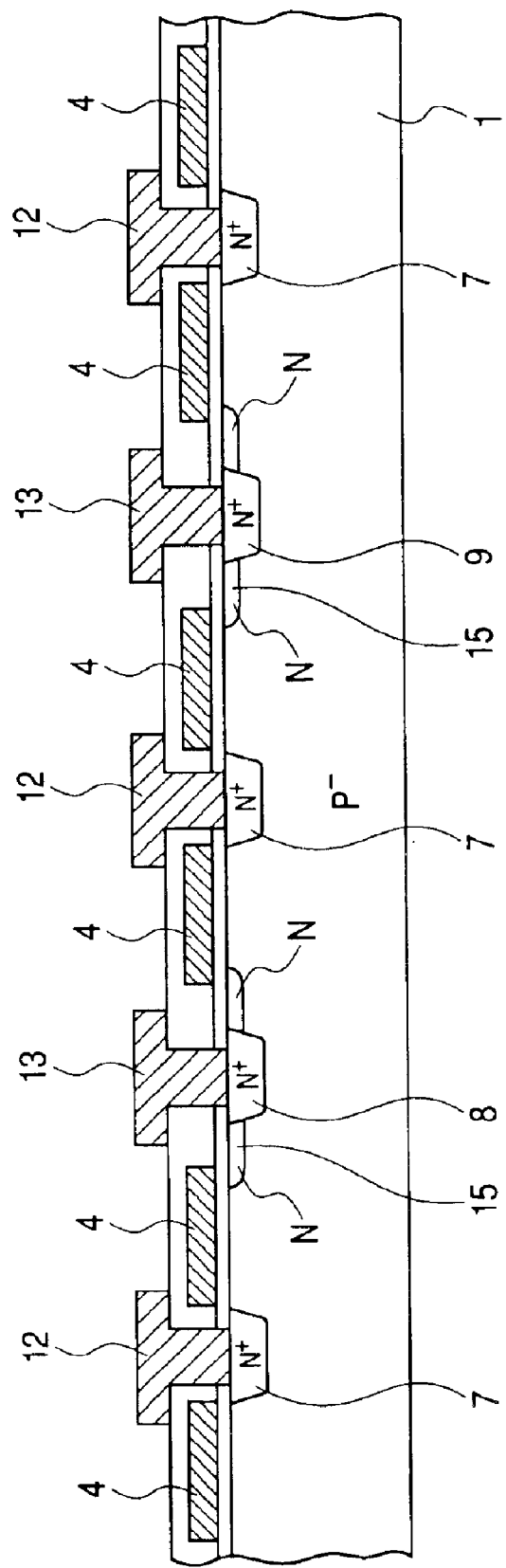
FIG. 12 is a schematic cross sectional view of the semiconductor device.

FIGS. 11 and 12 are a plan view and a cross sectional view of a MIS field effect transistor array. As a single or a plurality of MIS field effect transistors fabricated on a semiconductor substrate 1 are operated at the same time, the electric isolation between electrothermal conversion elements wired in a matrix shape can be maintained. In FIGS. 11 and 12, reference numeral 4 represents a gate electrode, reference numeral 7 represents an n-type source region, reference numeral 8 represents an n-type drain region, reference numeral 9 represents another n-type drain region, reference numeral 11 represents a contact, reference numeral 12 represents a source electrode, reference numeral 13 represents a drain electrode, and reference numeral 15 represents an n-type electric field relaxation drain region.

However, since such a conventional MIS field effect transistor array is operated under a large current necessary for driving electrothermal conversion elements, a pn reverse bias junction between the drain and well (in this example, between the drain and substrate) cannot resist against a high electric field, so that leak current flows and the breakdown voltage necessary for the electrothermal conversion element driving semiconductor device cannot be satisfied. Since a large current flows, if the on-resistance of a MIS field effect transistor is large, wasteful current is consumed in the transistor and current necessary for driving electrothermal conversion elements cannot be obtained.

Figure 13:
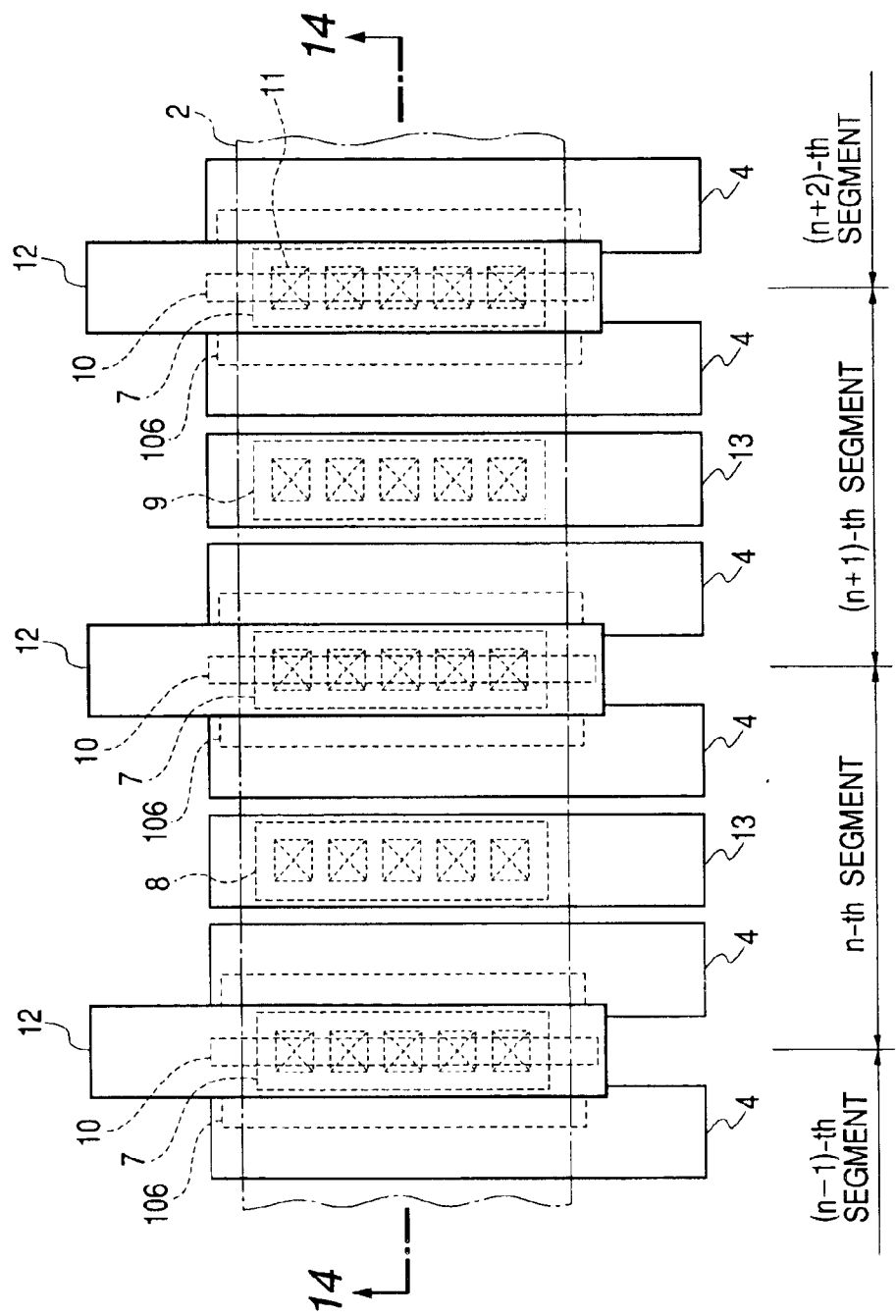
FIG. 13 is a schematic plan view of a semiconductor device.
Figure 14:
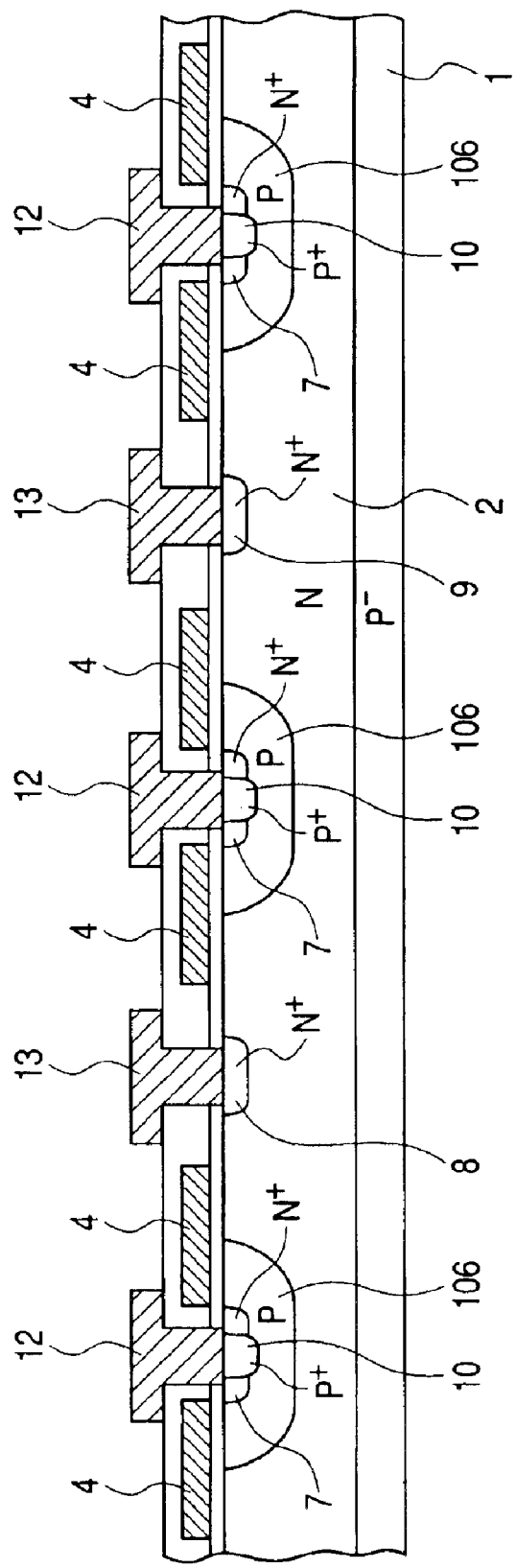
FIG. 14 is a schematic cross sectional view of the semiconductor device.

In order to improve the breakdown voltage, another type of a MIS field effect transistor may be used which is shown in the plan view of FIG. 13 and the cross sectional view of FIG. 14. In FIGS. 13 and 14, reference numeral 1 represents a p-type semiconductor substrate, reference numeral 2 represents an n-type well region, reference numeral 4 represents a gate electrode, reference numeral 106 represents a p-type base region, reference numeral 7 represents an n-type source region, reference numeral 8 represents an n-type drain region, reference numeral 9 represents another n-type drain region, reference numeral 10 represents a base electrode contact diffusion region, reference numeral 11 represents a contact, reference numeral 12 represents a source electrode and reference numeral 13 represents a drain electrode.

With the structure of this MIS field effect transistor different from an ordinary structure, since the channel is formed in the drain which determines a breakdown voltage, the drain can be made deep and can have a low impurity concentration to thereby improve the breakdown voltage.

However, if such MIS field effect transistors are disposed in an array shape, the drain of each transistor is formed in the single and common semiconductor layer and the drain potential of all transistors takes the same potential. Electric isolation between electrothermal conversion elements cannot therefore be maintained unless separated drains are formed by using a dedicated element separation region among switching elements which should be driven independently. If such an element separation region is to be newly formed, the manufacture processes become complicated, the manufacture cost rises, and the area occupied by the transistors becomes broad. From these reasons, the structure of the MIS field effect transistor shown in FIGS. 13 and 14 is not suitable for a transistor array to be used with a liquid jetting device.

According to the semiconductor device of each embodiment of the invention described above, it is possible to set the impurity concentration of a drain lower than that of a channel and form the drain deep. It is therefore possible to realize a large current due to a high breakdown voltage, a high speed operation due to a low on-resistance, high integration and energy saving. Electric isolation between transistors of a semiconductor device having an array structure of a plurality of transistors can be performed easily.

The layout of MIS field effect transistors of the structure shown in FIGS. 13 and 14 each having the characteristics almost equal to the present invention was formed by using the same design rule and the same number of masks. One segment of the MIS field effect transistor shown in FIGS. 13 and 14 requires 12.0 µm along the array extension direction. In contrast, one segment of the MIS field effect transistor shown in FIGS. 1 and 2 requires 6.0 µm along the array extension direction, which is a half of the conventional length. This size ratio (a ratio of the length of the structure shown in FIGS. 1 and 2 along the array extension direction to that of the structure shown in FIGS. 13 and 14) has a tendency that as the design rule becomes finer, the ratio becomes smaller.

<Liquid Jetting Device>

A liquid jetting device of the invention will be described by taking as an example an ink jet printer.

Figure 15:
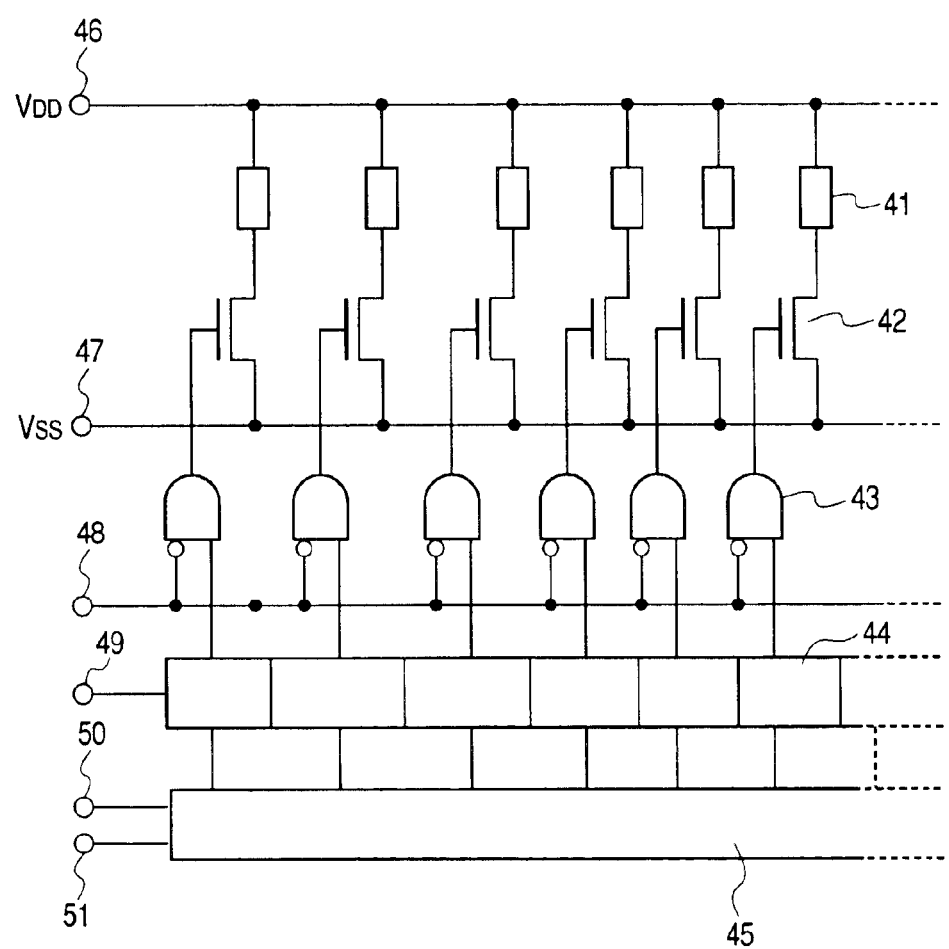
FIG. 15 is a circuit block diagram of a semiconductor device of the invention.

FIG. 15 is a diagram showing the circuit arrangement of a semiconductor device constituting a recording head of an ink jet printer. The semiconductor device is manufactured in accordance with any one of the above-described embodiments.

Reference numeral 41 represents an electrothermal conversion element array as a load, reference numeral 42 represents a switching element array, reference numeral 43 represents a logical gate array, reference numeral 44 represents latch circuits, and reference numeral 45 represents a shift register. Reference numeral 46 represents a terminal to which a power source voltage VDD is applied, reference numeral 47 represents a terminal to which a ground voltage VSS is applied, reference numeral 48 represents a terminal to which an enable signal is input, the enable signal controlling the timing when the switching element is turned on, reference numeral 49 represents a terminal to which a signal for controlling the latch circuits 44 is applied, reference numeral 50 represents a terminal to which an image signal is input, and reference numeral 51 represents a terminal to which a clock signal is applied. The electrothermal conversion element array 41, switching element array 42, logical gate array 43, latch circuits 44 and shift register 45 are disposed in parallel on one chip whose rough layout is the same as that shown in FIG. 15.

Digital image signals applied to the terminal 50 are made parallel by the shift register 45 and latched by the latch circuits 44. When the logical gates are enabled, the switching elements 42 are turned on or off in accordance with the latched signals in the latch circuits 44, so that current flows through the selected electrothermal conversion elements 41.

The transistor of each of the above-described embodiments is suitable for use as the switching element. As described earlier, a dedicated element separation region is not provided between switching elements of the switching element array, but it is preferable to form an element separation region such as a field insulating film between a plurality of arrays such as between the switching element array and electrothermal conversion element array and between the switching element array and logical gates (or latch circuits or shift register).

Figure 16:
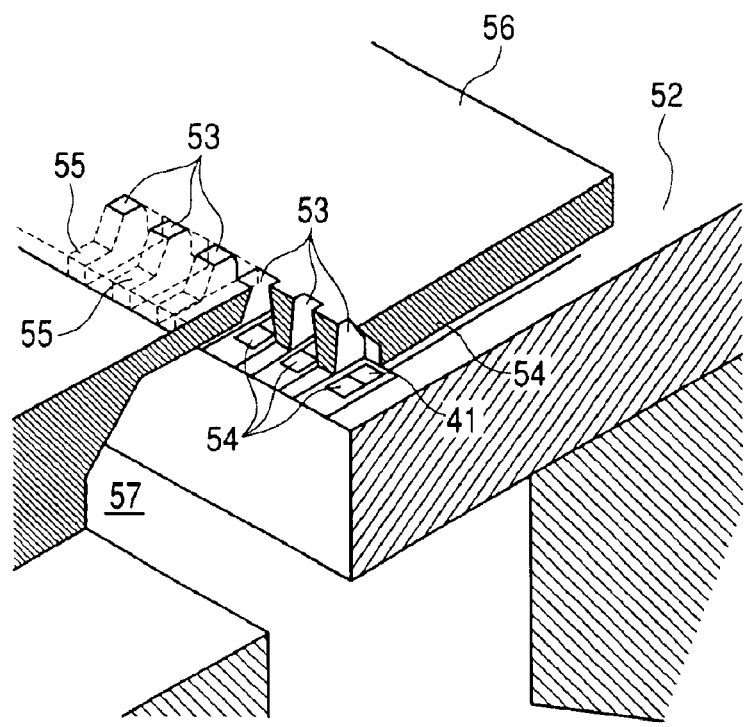
FIG. 16 is a schematic perspective view showing the structure of a liquid jetting head using a semiconductor device of the invention.

FIG. 16 is a schematic perspective view showing a portion of an ink jet head. A plurality of electrothermal conversion elements (heaters) 41 are disposed on an element main base 52 on which the circuit shown in FIG. 15 is fabricated. Each electrothermal conversion element generates heat when current flows through it, and a bubble generated by the heat is used for jetting out ink from a jet port 53. Each electrothermal conversion element is connected to a wiring electrode 54 whose end is electrically connected to the switching element 42. A flow path 55 is formed for each jet port 53 in order to supply ink to the jet port 53. A wall defining the jet port 53 and flow path 55 is mounted on a member 56 having grooves. This member 56 is coupled to the element main base 52 so that a plurality of flow paths 55 and a common liquid container 57 for supplying ink to the flow paths are formed.

Figure 17:
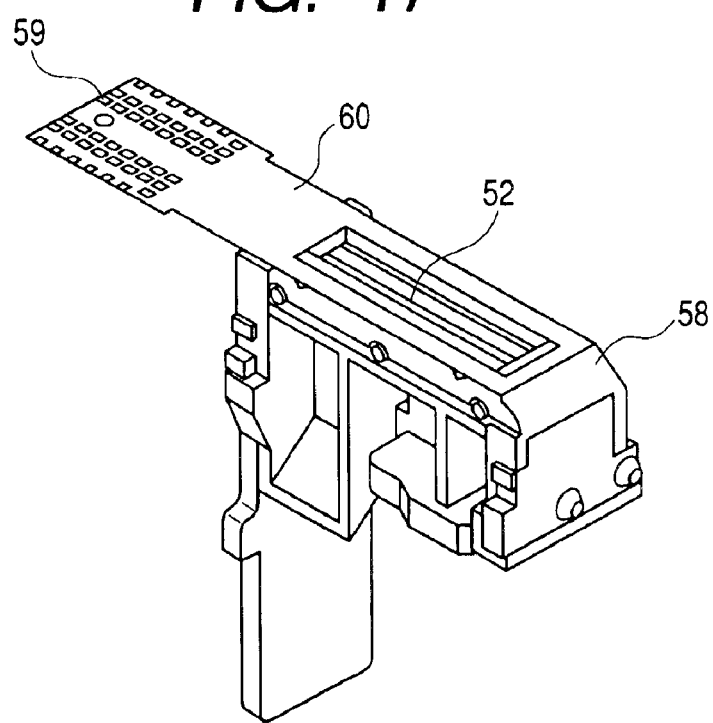
FIG. 17 is a schematic perspective view showing the structure of a liquid jetting head using a semiconductor device of the invention.

FIG. 17 is a perspective view showing the structure of an ink jet head mounted with the element main body 52. On this element main body 52, the member 56 defining the jet ports 53 and flow paths 55 is mounted. A contact pad 59 is provided for receiving an electric signal from the apparatus side. A controller of the apparatus supplies an electric signal such as various drive signals to the element main base 52 via a flexible printed circuit board 60.

Figure 18:
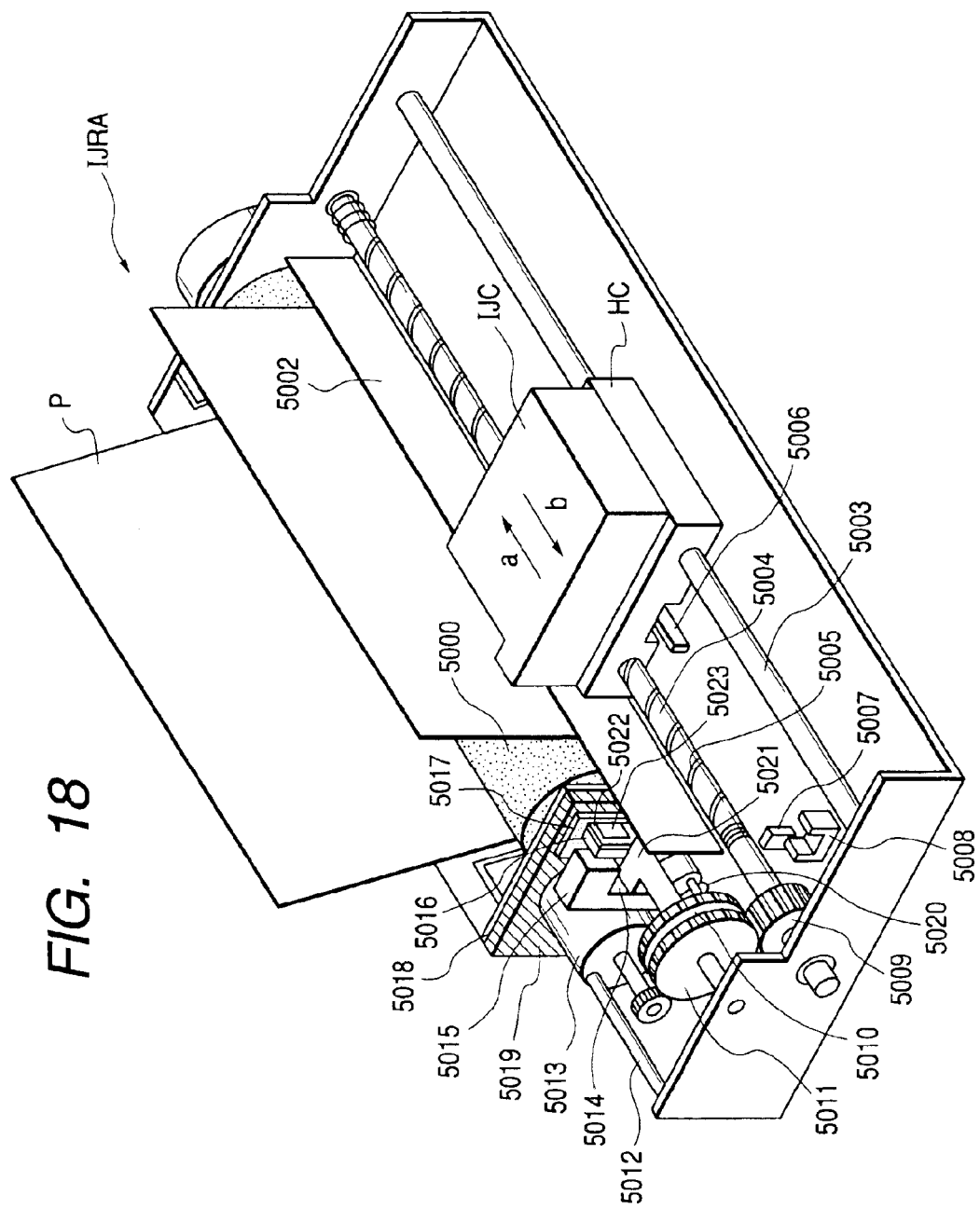
FIG. 18 is a schematic diagram showing an example of a liquid jetting apparatus of the invention.
Figure 19:
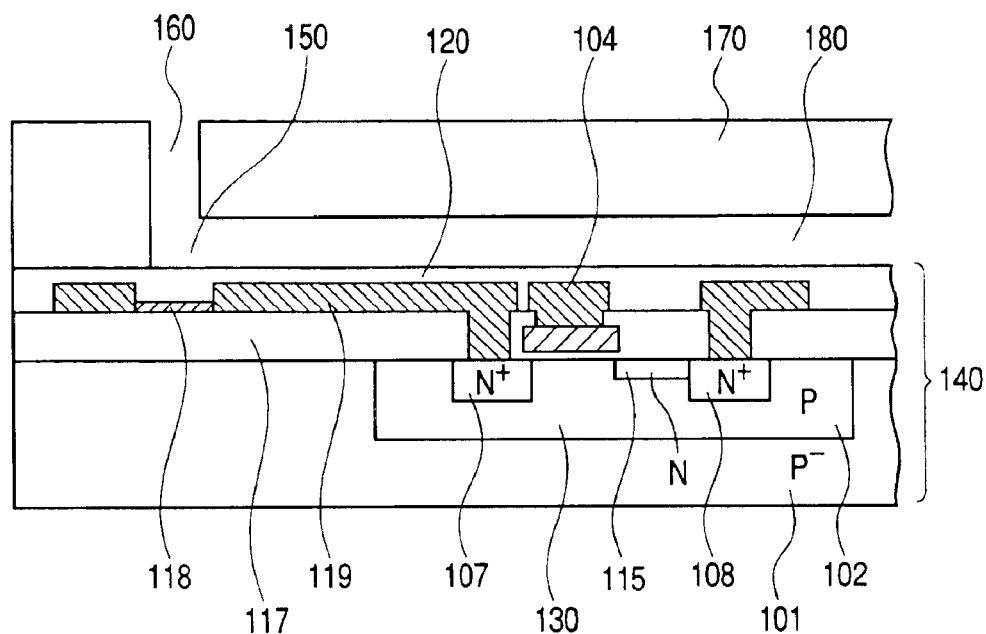
FIG. 19 is a schematic cross sectional view of a conventional liquid jetting head.

FIG. 18 is a perspective view of an ink jet recording apparatus IJRA using an ink jet head. A carriage HC having a pin (not shown) and engaging with a spiral groove 5004 of a reed screw 5005 is reciprocally moved in arrow directions a and b, the reed screw being rotated by drive force transmitted via gears 5011 and 5009 which are rotated in response to a normal or reverse rotation of a drive motor 5013. Reference numeral 5002 represents a paper push plate for pushing a paper sheet against a platen 5000 used as a recording medium transporting means, along the whole motion length of the carriage. Reference numerals 5007 and 5008 represent a photocoupler used as a home position detecting means for detecting a lever 5006 of the carriage to switch the rotation direction of the motor 5013. Reference numeral 5016 represents a member for supporting a cap member 5022 which caps the front of the recording head, and reference numeral 5015 represents a suction means for sucking the inside of the cap to perform a suction/recovery operation for the recording head via an opening 5023 formed through the wall of the cap. Reference numeral 5017 represents a cleaning blade, and reference numeral 5019 represents a member for moving the blade back and forth, the blade and member being supported by a main support plate 5018. Obviously, the blade may have another structure such as a well-known cleaning blade. Reference numeral 5021 represents a lever for starting suction of suction/recovery. This lever is moved while a cam 5020 engaged with the carriage moves, and controlled by a drive force of the driving motor transmitted by a well-known transmission means such as a clutch.

This apparatus has a controller (not shown) which is constituted of an electronic circuit for supplying the element main base 52 with an image signal, a drive control signal and the like.

As described so far, according to the invention, since the drain impurity concentration can be set lower than the channel impurity concentration and the drain can be formed sufficiently deep, it is possible to realize a large current due to a high breakdown voltage, a high speed operation due to a low on-resistance, high integration and energy saving. According to the invention, electric isolation between transistors of a semiconductor device having an array structure of a plurality of transistors can be realized without raising cost. According to the invention, it is possible to provide transistor arrays having uniform characteristics and high density integration.

What is claimed is:

1. A semiconductor device having a plurality of electrothermal conversion elements and a plurality of switching elements for flowing current through the electrothermal conversion elements, respectively formed on a semiconductor substrate of a first conductivity type, wherein:

each of said switching elements is an insulated gate field effect transistor comprising:

a first semiconductor region of a second conductivity type opposite to the first conductivity type, said first semiconductor region being formed on a principal surface of said semiconductor substrate;

a second semiconductor region of the first conductivity type for providing a channel region, said second semiconductor region being formed adjacent to said first semiconductor region;

a source region of the second conductivity type formed in a surface layer of said second semiconductor region;

a drain region of the second conductivity type formed in a surface layer of said first semiconductor region; and a gate electrode formed on a gate insulating film on the channel region;

and a resistivity of said semiconductor substrate is 5 to 18 $\Omega$cm, and said first semiconductor region has a depth of 2.0 to 2.2 $\mu$m along a depth direction of said semiconductor substrate and an impurity concentration of $1\times10^{14}$ to $1\times10^{18}$/cm$^3$.

2. A semiconductor device according to claim 1, wherein said second semiconductor region is formed adjacent to said semiconductor substrate.

3. A semiconductor device according to claim 1, wherein the resistivity of said semiconductor substrate is 5 to 16 $\Omega$cm.

4. A semiconductor device according to claim 1, wherein a layout direction of said electrothermal conversion elements is parallel to a layout direction of said switching elements.

5. A semiconductor device according to claim 1, wherein said drain regions of at least two insulated gate field effect transistors are connected to each of said electrothermal conversion elements, and said source regions of said at least two insulated gate field effect transistors are connected in common.

6. A semiconductor device according to claim 1, wherein an effective channel length of the insulated gate field effect transistor is determined by a difference of lateral impurity diffusion amounts of said second semiconductor region and said source region.

7. A semiconductor device according to claim 1, further comprising an electrode contact diffusion region of the first conductivity penetrated through said source region.

8. A semiconductor device according to claim 1, wherein a portion of said gate electrode on a drain side is formed on an insulating film thicker than the gate insulating film.

9. A semiconductor device according to claim 1, wherein a portion of said gate electrode on a drain side is formed on a field insulating film.

10. A semiconductor device according to claim 1, further comprising a liquid jet port provided for each of said electrothermal conversion elements.

11. A semiconductor device according to claim 1, wherein said electrothermal conversion elements are made of thin film resistors formed on said semiconductor substrate.

12. A liquid ejecting device comprising:

a semiconductor device recited in any one of claims 1 to 9 and 11 and provided with a liquid jet port for each of said electrothermal conversion elements;

a liquid container for housing liquid to be ejected out of each liquid jet port by said electrothermal conversion elements; and a controller for supplying a drive control signal which drives the insulated gate field effect transistor of said semiconductor device.

* * * * *

UNITED STATES PATENT AND TRADEMARK OFFICE
CERTIFICATE OF CORRECTION

PATENT NO. : 6,867,457 B2
DATED : March 15, 2005
INVENTOR(S) : Yukihiro Hayakawa et al.

It is certified that error appears in the above-identified patent and that said Letters Patent is hereby corrected as shown below:

<u>Title page</u>,
Item [56], References Cited, FOREIGN PATENT DOCUMENTS,
"1221720 A2" should read -- 1 221 720 A2 --;
"0574911 A2" should read -- 0 574 911 A2 --;
"2309589 A" should read -- 2 309 589 A --.

<u>Drawings</u>,
Sheet 20, FIG. 23, "Pusb" should read -- Psub --.

<u>Column 1</u>,
Line 33, "a" should read -- an --.

<u>Column 5</u>,
Line 46, "this" should read -- these --; and
Line 49, "length-of" should read -- length of --.

<u>Column 7</u>,
Line 36, "boarder" should read -- border --;
Line 57, "deice" should read -- device --.

<u>Column 10</u>,
Line 34, "using," should read -- using --.

<u>Column 11</u>,
Line 11, "not" should read -- not be --.

<u>Column 12</u>,
Line 3, "formed" should read -- formed and --.

UNITED STATES PATENT AND TRADEMARK OFFICE
CERTIFICATE OF CORRECTION

PATENT NO. : 6,867,457 B2
DATED : March 15, 2005
INVENTOR(S) : Yukihiro Hayakawa et al.

It is certified that error appears in the above-identified patent and that said Letters Patent is hereby corrected as shown below:

Column 16,
Line 20, "device-according" should read -- device according --.

Signed and Sealed this

Twelfth Day of July, 2005

JON W. DUDAS
*Director of the United States Patent and Trademark Office*